United States Patent [19]
Easley

[11] Patent Number: 6,037,993
[45] Date of Patent: Mar. 14, 2000

[54] DIGITAL BTSC COMPANDER SYSTEM

[75] Inventor: Matthew Frank Easley, Woodstock, Ga.

[73] Assignee: Antec Corporation, Duluth, Ga.

[21] Appl. No.: 09/038,740

[22] Filed: Mar. 11, 1998

Related U.S. Application Data

[60] Provisional application No. 60/041,157, Mar. 17, 1997.

[51] Int. Cl.[7] .................................................. H04N 7/08
[52] U.S. Cl. .............................. 348/485; 382/2; 348/484
[58] Field of Search ................................... 348/485, 483, 348/481; 381/2–4

[56] References Cited

U.S. PATENT DOCUMENTS

| | | |
|---|---|---|
| 3,681,618 | 8/1972 | Blackmer . |
| 3,714,462 | 1/1973 | Blackmer . |
| 3,789,143 | 1/1974 | Blackmer . |
| 4,048,654 | 9/1977 | Wegner . |
| 4,097,767 | 6/1978 | Blackmer et al. . |
| 4,101,849 | 7/1978 | Blackmer et al. . |
| 4,112,254 | 9/1978 | Blackmer . |
| 4,124,784 | 11/1978 | Johnson et al. . |
| 4,136,314 | 1/1979 | Blackmer et al. . |
| 4,139,866 | 2/1979 | Wegner . |
| 4,177,356 | 12/1979 | Jaeger et al. . |
| 4,182,930 | 1/1980 | Blackmer . |
| 4,182,993 | 1/1980 | Tyler . |
| 4,220,929 | 9/1980 | Talbot et al. . |
| 4,234,804 | 11/1980 | Bergstrom . |
| 4,316,060 | 2/1982 | Adams et al. . |
| 4,316,107 | 2/1982 | Talbot . |
| 4,329,598 | 5/1982 | Welland . |
| 4,331,931 | 5/1982 | Adams . |
| 4,368,425 | 1/1983 | Adams . |
| 4,377,792 | 3/1983 | Blackmer et al. . |
| 4,403,199 | 9/1983 | Blackmer . |
| 4,409,500 | 10/1983 | Welland . |
| 4,425,551 | 1/1984 | Blackmer et al. . |
| 4,430,626 | 2/1984 | Adams . |
| 4,434,380 | 2/1984 | Welland . |
| 4,445,053 | 4/1984 | Jaeger et al. . |
| 4,454,433 | 6/1984 | Welland . |
| 4,467,287 | 8/1984 | Aylward . |
| 4,471,324 | 9/1984 | Welland . |
| 4,473,793 | 9/1984 | Blackmer et al. . |
| 4,503,553 | 3/1985 | Davis . |
| 4,503,554 | 3/1985 | Davis . |
| 4,539,526 | 9/1985 | Davis . |
| 4,588,979 | 5/1986 | Adams . |
| 4,661,851 | 4/1987 | Muterspaugh ........................ 348/485 |
| 4,704,726 | 11/1987 | Gibson ................................. 348/485 |
| 5,124,793 | 6/1992 | Sakamojo ............................. 348/485 |
| 5,684,878 | 11/1997 | Nagura ..................................... 381/2 |

OTHER PUBLICATIONS

That Corporation, "dbx–TV Noise Reduction Systems" data sheet, Sep. 1993.
"BTSC Made Easy" undated.

(List continued on next page.)

*Primary Examiner*—Victor R. Kostak

[57] ABSTRACT

An apparatus for generating a broadcast television stereo signal has a left channel and a right channel. An analog-to-digital converter converts the right-channel signal to a right digital signal and the left-channel to a left digital signal. A circuit, which could include a digital signal processing chip, generates a first signal that includes the right digital signal added to the left digital signal and generates a second signal that includes the right digital signal subtracted from the left digital signal. The circuit also generates a digitally pre-emphasized first signal, which includes digital pre-emphasis, and a digitally pre-emphasized second signal, which also includes digital pre-emphasis. The circuit transforms the pre-emphasized first signal to a digital BTSC L+R signal and transforms the pre-emphasized second signal to a digital BTSC L−R signal. A digital-to-analog converter converts the digital BTSC L+R signal to an analog BTSC L+R signal and the digital BTSC L−R signal to an analog BTSC L−+R signal. The analog BTSC L+R and L−R signals are then modulated onto a carrier wave.

9 Claims, 14 Drawing Sheets

OTHER PUBLICATIONS

Farmer, "RF/BTSC Interaction" undated.
Farmer, et al., "Practical Experience with Stereo Cablecasting" undated.
Eilers, "The Zenith Multichannel TV Sound System" undated.
Robbins, "FM Stereo Multiplex Signals" undated.
Keller, "Stereo Audio in Television: The BTSC Multichannel Sound System," SMPTE Tutorial Paper, Feb. 16, 1985.
Farmer, et al., "Cable and BTSC Stereo," Communications Engineering and Design Magazine, Apr. 1987.
Best, "Considerations in the Operation of CATV Headends Carrying BTSC Stereo Signals," 1985 NCTA Technical Papers, pp. 130–133.
Bowick, "The Importance of Setting and Maintaining Correct Signal and Modulation Levels in a CATV System Carrying BTSC Stereo Signals," 1986 NCTA Technical Papers.
Tyler, et al., "A Companding System for Multichannel TV Sound," IEEE Transactions on Consumer Electronics, Nov. 1984, vol. CE–30, No. 4.
Loudspeakers and Sound Systems, Section 13.5 Audio Processing Equipment, pp. 13.31–13.39, undated.
"dbx–TV Noise Reduction System Overview," Aug. 1991.
"dbx–TV for Broadcast Equipment," Appendix B, Jul. 21, 1994, pp. 1–5.
Multichannel Television Sound BTSC System Recommended Practices undated.
Principles of Operation, Section 2 undated.

EXISTING ART

EXISTING ART

EXISTING ART

EXISTING ART

BTSC ENCODER-
HARDWARE
BLOCK DIAGRAM

FIG. 6 BTSC ENCODER- ALGORITHM BLOCK DIAGRAM;
(L − R) & (L + R) CHANNELS

BTSC ENCODER- ALGORITHM BLOCK DIAGRAM;
SAP CHANNEL

DIGITAL BTSC COMPANDER SYSTEM The present patent application claims the benefit of priority of U.S. Provisional Patent Application Ser. No. 60/041,157, filed Mar. 17, 1997, and entitled "Digital BTSC Compander System".

FIELD OF INVENTION

This application relates to signal conditioning system, and more particularly to a digital compander system that is compatible with the FCC's approved BTSC encoding standards.

BACKGROUND OF INVENTION

On Mar. 29, 1984, the FCC Report and Order in Docket No. 21323 adopted and authorized a standard for multichannel television sound (MTS). Bulletin No. 60 of the Office of Science and Technology, "Multichannel Television Sound Transmission and Audio Processing Requirement for the BTSC System" (OST 60) contains the technical specifications for the above mentioned MTS adopted by the FCC.

The MTS system, known variously as MTS, BTSC stereo, or broadcast TV stereo, consists of two parts: an overall transmission system, and a noise reduction, or companding system. The "BTSC System Multichannel Television Sound Recommended Practices" (BTSC Standard) defines companding as: "a noise reduction process used in the stereophonic subchannel and in the second audio program subchannel consisting of compression (encoding) before transmission and complementary expansion (decoding) after reception. (This definition conforms to "companding" in OST 60 Section A)."

Without companding, the transmission system is capable of delivering high-quality stereophonic audio. However, FM-transmission systems experience squared relationship between noise and frequency (Parabolic Noise Characteristic) resulting in higher noise at the higher frequencies. In addition, to avoid causing interference, the BTSC Standard limits the amount of modulation that can be applied to the stereophonic signal. Thus, even under ideal conditions, the addition of the subcarrier adds approximately 15 dB of noise to stereophonic (stereo) reception compared to monophonic (mono) reception. To make matters worse, under certain impaired transmission/reception conditions, such as a weak received signal, transmitter ICPM and multipath effects, buzz or hum can be introduced onto the transmitted audio. Thus, without companding, the service area for stereophonic TV (stereo-TV) reception is smaller than for monophonic TV (mono-TV) reception.

The situation is worse for the Second Audio Program (SAP) channel. The SAP subcarrier frequency is 78.7 KHz, much higher than for the stereo signal; therefore, the Parabolic Noise Characteristic results in even more noise in the signal. Furthermore, this subcarrier uses FM, which is additionally subject to picture-to-audio intermodulation (buzz beat), causing a particularly annoying distortion.

The BTSC noise-reduction system was designed to be a cost-effective aid to the MTS transmission system in delivering a clean, noise-free audio signal into the home. Specifically, the system was designed to: provide significant noise reduction even in poor reception areas while preserving input-signal dynamic range; prevent the stereo-subcarrier from interfering with overall transmitted power levels (AM-interleave effects); ensure reliable performance even in the face of manmade noise and transmission/reception-system impairments; and to provide these benefits at a commercially reasonable cost.

To achieve the above-stated goals, the BTSC Standard departed from previous design approaches where the dynamic range of the impaired channel was very low. In the case of the stereo-subcarrier in Grade B reception, the available dynamic range was about 43 dB, while in the SAP channel the dynamic range was about 26 dB. These compare unfavorably with the typical dynamic range of a compact cassette at about 60 dB. The significance of these figures, the operation of prior art compander systems, and the operation of the current invention will be better understood after a discussion of the psychoacoustic phenomenon of masking.

All audio noise-reduction systems work on the principle of masking; a listener will be oblivious to the noise on a transmission when the program signal, music or speech, is loud enough and its spectral content is broad enough, to mask the noise.

For example, if the program consists of low-frequency sounds, it must be transmitted at a high level relative to the background noise of the stereo-subcarrier channel to capture the listener's attention and for the listener to be unaware of the background noise. On the other hand, a broadband signal does not need to be much higher in amplitude than the background noise for the noise to fade below the listener's perception threshold. See, for example, I. M. Young, and C. H. Wenner, *Masking of White Noise by Pure Tone, Frequency-Modulated Tone, and Narrow-Band Noise*, J. Acoust. Soc. Am. 41, pp. 700–705, 1967.

The noise reduction system must compress and encode the audio signal such that it will consistently mask the channel noise during transmission, and then decode and expand the transmitted signal to recover the original audio signal. In passing through the encode/decode (companding) cycle, distortion or other degradation of the audio signal must be kept to a minimum. And in the decoding process, all the audible noise should be eliminated. Thus, not only must the level of the transmitted audio be high relative to the background noise, but the frequency of the signal and noise must be considered when selecting or designing an effective noise masking and companding scheme. Other characteristics of the signal and noise will affect the design of an ideal companding system. Thus, the amplitude of the signal, the rate at which the signal changes amplitude, and even whether the signal is decreasing or increasing are also important parameters in the design of an ideal companding system.

The stereo-subcarrier's background-noise spectrum is white, rising at 3 dB-per-octave. By comparison, the SAP subcarrier noise rises at 9 dB-per-octave. The noise can be masked if the transmitted signal's spectrum contains substantial high-frequency, especially in the case of the SAP channel. If so, the compander would only have to keep the signal amplitude levels high through the transmission medium. However, most TV program materials have their dominant energy at low frequencies. Alternatively, if the program consistently lacked high-frequency content, one could simply apply a constant rising preemphasis characteristic to the entire audio spectrum.

However, today's TV program content, especially music and movie effects, is neither consistently high frequency nor low frequency, for either approach to work. Inevitably, the signal will have instances of high-level, high-frequency energy in the audio signal, where a constant rising preemphasis would cause headroom (overload distortion) problems.

Existing solutions to the problem of preserving psychoacoustic masking and simultaneously preserving headroom at all frequencies use spectral companding, a preemphasis scheme which adapts its characteristic to suit the signal. The spectral compressor in the encoder measures the spectral balance of the input signal and varies the high-frequency-preemphasis accordingly, merely increasing the potential for masking, and reducing the possibility of high-frequency overload. The resulting encoded signal is, therefore, dynamically adjusted to consistently contain a substantial proportion of high frequencies before transmission, thereby masking the channel noise.

During reception, the spectral expander (in the decoder) restores the high frequencies to their proper amplitude. If the original input signal contains predominantly low frequencies, the decoder attenuates the high-frequency background noise, leaving the low-frequency signal and low-frequency background noise, the latter of which is masked by the signal itself. If the original input signal contains predominantly high frequencies, the decoder does not attenuate the high frequencies to restore correct frequency response, since the signal itself masks the noise.

The spectral compressor achieves two simultaneous requirements: the system is forgiving of high-background-noise environments because the spectral shaping of the input signal is adjusted according to the needs of the input signal to provide high masking at all times, and headroom is maintained throughout the frequency range because extreme preemphasis is used only when it is really needed.

While the spectral compressor continuously adapts its characteristics to the specific nature of the program material, typically a significant overall preemphasis is needed during encoding to provide adequate masking. Instead of designing the spectral compressor to operate only as a preemphasis network, the BTSC system lets the spectral compressor, and hence the spectral expander, operate with a symmetric boost and cut, while obtaining the bias toward preemphasis from fixed preemphasis networks.

The spectral compander works in conjunction with the wideband compressor, thus the 2:1 wideband compressor senses the input signal level and adjusts a variable-gain stage to reduce the amplitude of large input signals and boost the amplitude of small input signals. This way, the amplitude dynamic range at the output of the wideband compressor is half that at the input.

The wideband compressor produces an output signal of relatively constant level. The choice of this level affects how well the noise is masked, higher levels being better, and how cleanly transients are reproduced, lower levels being better. The BTSC Standard has set this level at about 17 dB below 100% modulation at 300 Hz. This allows room for transients to overshoot in the compressor without causing excessive distortion through a complete companding cycle and ensures the program signal has a sufficiently high amplitude to mask the background noise.

On decode, the wideband expander restores the original program dynamics. During quiet passages, the expander attenuates the background noise, while during passages of significant signal amplitude level, the program itself masks the noise.

Another important concern of the BTSC design is to protect against large transients causing excessive modulation of the transmission system. In a peak-limited medium, such as the MTS transmission system, the peak excursion of the compressor output is an important parameter to control. This requirement can most easily be met by a clipper or limiter.

Clippers are relatively inaudible in operation provided that the clipper clips only transients that last under a few milliseconds. To accomplish this the unaffected-level point of the wideband compressor is set below 100% modulation point (Unaffected Level); and the wideband and spectral compressors, which precede the clipper, are set fast enough to allow only brief overloads to reach the clipper. Furthermore, the static preemphasis precedes the clipper, further reducing the transient overload duration. Aiming at a signal level for the output of the encoder that is substantially below 100% modulation, provides room for the typical peak excursions that occur when normal musical and other program transients are input to the compressor.

An important benefit of the Unaffected Level alignment is that the signal level broadcast over the stereo-subcarrier has its amplitude distribution between 10% to 30% modulation. This allows for large amplitudes in the monophonic carrier without exceeding the allowable modulation limits of monophonic plus stereophonic carriers. Since the stereo-subcarrier tends to average below 30% modulation, the mono carrier is allowed to stay around 70% modulation.

To protect the 15.734 KHz pilot signal and to prevent any spillover of signals into the sum channel, the difference channel must not contain information above about 15 KHz. This is accomplished by a lowpass filter in the encoder. For example, an 11-pole Cauer filter has been used for such application. This filtering process causes a phase shift in the difference channel (L–R signal) which must be compensated for in the sum (L+R) channel. This lowpass filter is located at the encoder output, but within the feedback loop, so that the RMS-level detectors in both the compressor and expander sense the same bandlimited signal. This is a limitation in prior art BTSC encoding, as it often requires high order filters and, as discussed below, often requires the use of matching filter components.

The ideal low-pass filter should pass the frequencies from 30 Hz to 15 KHz with minimal attenuation, have peak attenuation at 15.734 KHz, and maintain substantial attenuation above 15.734 KHz. Specific requirements for this filter can be found in the EIA document "BTSC System Television Multichannel Sound Recommended Practices". Note that the phase shift introduced by this filtering must be compensated for by an identical Phase shift in the sum (L+R) channel, or stereo separation will be significantly degraded. This is usually accomplished by using identical, matched filters in the L–R and L+R channels. This is a limitation in prior art BTSC encoding, since filter matching increases manufacturing costs, and errors in filter matching degrade performance.

The received demodulated difference (L–R) signal has high-frequency components caused by the other audio channels in the system, which could interfere with proper decoding if they are not attenuated before reaching the expander detectors. Therefore, filtering is necessary to prevent decoder mistracking. Pilot cancellation techniques will reduce the amount of 15.734 KHz in the L–R signal, and therefore reduce the required attenuation of the filter. There are many possible circuit variations which call for different alignments for this filter. For example, the filter may be located in the L–R signal path. However, this requires a compensating network, which in turn usually requires a matching filter to be located in the L+R signal path to maintain separation. Again, this exemplifies a limitation in prior art BTSC encoding, by requiring filter matching and additional hardware components.

OST 60 describes a theoretically perfect compressor. Due to bandwidth limitations of presently available components, it may not be practical to conform perfectly to the ideal design of OST 60. This means that small deviations from perfect amplitude and phase response may exist in practical encoders, especially at the edges of the audio band. Such deviations may be compensated for by amplitude and phase errors introduced in the sum channel. Note that any deviations from perfect amplitude response in the encoder will be exaggerated by the expansion action of the decoder. For this reason, somewhat more amplitude response error must be placed in the sum channel than in the difference channel if the sum-channel response is to match that of the difference channel, including an encode/decode cycle. The amount of exaggeration of the error varies with frequency because the effective compression ratio varies with frequency. However, encoder phase errors should be compensated for with identical errors in the sum channel, since the decoder will not exaggerate phase errors.

The above discussion illustrates a significant limitation in prior art BTSC encoding. The hardware components introduce amplitude and phase errors, which errors, if not properly corrected or compensated for, will be magnified upon decoding; thus necessitating a frequency dependent overcompensation of the error. Furthermore, in prior art practice, it is an already accepted fact that due to bandwidth limitations of presently available components, it is not practical to conform perfectly to the ideal design of OST 60. Being unable to achieve the ideal requirements, the industry deviates from the ideal design during the signal encoding and compression. The signal decoding and decompression does not always compensate for such deviations, resulting in less than ideal noise reduction techniques.

The sum-channel compensation at the transmission end must correct only for phase and amplitude errors introduced by the encoder, while errors introduced by the decoder must be corrected only at the reception end. This allows freedom for future improvements in the state of the art. Furthermore, by compensating for transmission errors only in the transmitter, receiver manufacturers are free to build more nearly ideal receivers, rather than being forced to build errors into the receiver which compensate for errors in the transmitter. Also, by having the receiver end and the transmitter end compensate for their errors and limitations, this maintains receiver and transmitter independence and it does not impose a burden on either end to correct or compensate for errors or limitations of the other end.

As it is inherently typical with the adoption of a standard, the standard constrains the users to work and use that standard alone, thereby often stagnating the technological growth in the relevant field, or otherwise constraining the standard users and limiting the use of technology that may become superior by virtue of improvements in technology, or reductions in manufacturing costs. In the case of stereo-TV, because of compatibility concerns, a new and modem television set must be compatible with a 10 or 20 year old standard, effectively denying a consumer the enjoyment that could otherwise be available by improvements in technology.

Prior art BTSC systems are effective in compressing and expanding the signal upon reception. However, prior art systems often are not very sensitive and responsive to transients where the signal amplitude quickly increases or decreases. Specifically, many expanders are unable to follow rapid envelope changes without producing undesirable acoustic effects, such as pumping and breathing. Many expanders try to overcome the above mentioned problems by slowing down its response to sudden amplitude changes. This, however, results in a response that is too slow to follow fast changing musical envelopes. Attempts to increase the response to said sudden amplitude changes often results in increased low frequency distortion and the above-mentioned pumping and breathing.

One existing system attempts to cure the above mentioned problems by varying the amplitude of the control signal as a function of the time derivative of the control signal. To achieve this, one system employs a lead-lag circuit including a diode. The diode is forward biased, resulting in fast reaction time to positive changing signals. However, the proportional derivative and lead-lag circuits are bi-polar and are unable to distinguish between positively increasing and negatively increasing signals. As a result, the response to negatively changing signals typically result in psychoacoustic distortion. In addition, the release behavior of the gain control module disclosed therein is non-linear which also affects the envelope and results in distortion. Furthermore, the circuit requires the selection of analog components to set a precise time-constant for a particular type of release, which time constant may be satisfactory for some types of programs, but not for others.

Another system attempts to overcome the diode limitation problems and non-linear circuit behavior. However, this is accomplished again via the use of diodes and other non-linear components, thereby requiring more complex circuit systems, extensive compensation and component selection.

Accordingly, there is a need for a means to achieve BTSC encoding and decoding without having to contend with the non-linearity of components, independent of component tolerances and independent of variations in environmental conditions.

Also, there is a need to encode and decode a signal that is fully compatible and in compliance with current Multichannel Television Sound BTSC systems that does not deviate from the ideal low-pass filter recommended in the EIA document "BTSC System Television Multichannel Sound Recommended Practices," that does not introduce undesirable phase shift or distortions, and that does not require the matching of filters or other components.

Also, there is a need for an encoder/decoder system, method and apparatus that exhibits greater signal to noise separation, improved performance characteristics throughout the spectrum of the signal, and improved response time and performance characteristics to sudden changes in the amplitude and/or frequency of the signal.

There is also a need to provide for the above-mentioned improvements at a reduced cost, while providing the service providers with means to adjust the encoder/decoder performance characteristics according to the type of program being transmitted, and preferably being adjustable on a real-time basis according to the instantaneous needs of the program.

There is also a need for an encoding/decoding system that can grow with and change with the changing needs in the market and advances in the technology, and is not bound or limited to perform according to a fixed standard.

There is further a need to provide for the above-mentioned improvements without sacrificing compatibility with current BTSC standards and without sacrificing performance on prior art television sets.

SUMMARY OF INVENTION

In one aspect, the present invention is an apparatus for generating a broadcast television stereo signal having a left channel and a right channel. An analog-to-digital converter converts the right-channel signal to a right digital signal and the left-channel to a left digital signal. A circuit, which could include a digital signal processing chip, generates a first signal that includes the right digital signal added to the left digital signal and generates a second signal comprising the right digital signal subtracted from the left digital signal. The circuit also generates a digitally pre-emphasized first signal, which includes digital pre-emphasis, and a digitally pre-emphasized second signal, which also includes digital pre-emphasis. The circuit transforms the pre-emphasized first signal to a digital BTSC L+R signal and transforms the pre-emphasized second signal to a digital BTSC L–R signal. A digital-to-analog converter converts the digital BTSC L+R signal to an analog BTSC L+R signal and the digital BTSC L–R signal to an analog BTSC L–+R signal. The analog BTSC L+R and L–R signals are then modulated onto a carrier wave.

This and other aspects of the invention will become apparent upon reading the following specification in conjunction with the accompanying drawings.

DETAILED DESCRIPTION OF THE INVENTION

The BTSC Specification is intended to serve the industry in the form of recommendations for anyone wishing to practice multichannel television sound (MTS) in accordance with the BTSC system and the FCC Rules governing its use. OST Bulletin No. 60 gives a technical description of the BTSC system. The BTSC Specification and OST Bulletin No. 60 are jointly referred herein as the BTSC Standard. The BTSC Standard is intended for equipment manufacturers and broadcasters, providing the manufacturers with information useful in making design tradeoffs and recommended performance standards. For broadcasters, the BTSC Standard provides information to allow individual equipment items to be defined in terms of performance so that the transmitter plant will perform properly as a system. Furthermore, the BTSC Standard identifies receiver issues, which are of significance to the broadcaster and the receiver manufacturer.

Figure 1:
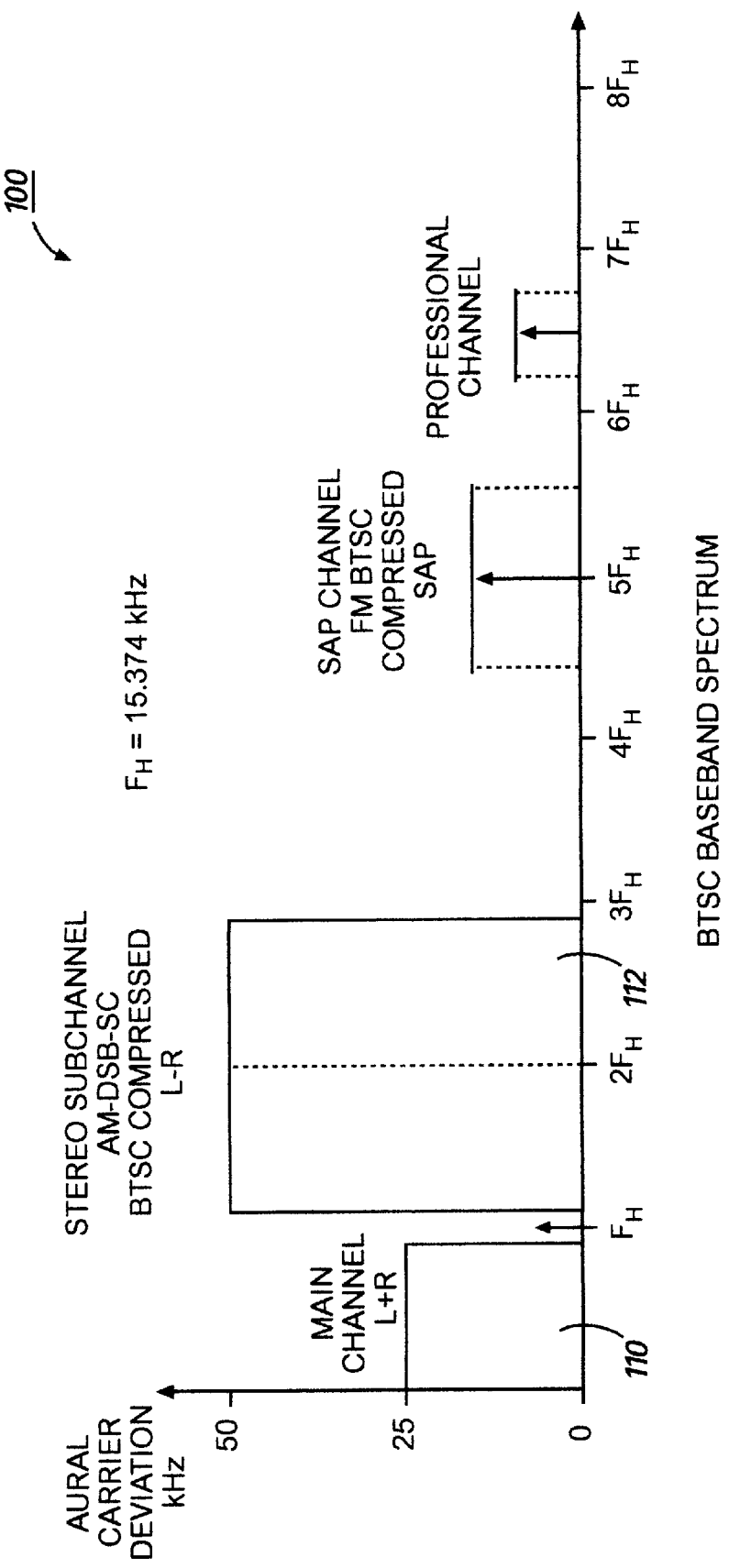
FIG. 1 illustrates the BTSC baseband frequency spectrum.

The transmission standards are graphically illustrated in FIG. 1 and summarized in Table 1. The main channel (L+R) signal 110, consists of the sum of left plus right audio signals. The stereophonic subchannel (L–R) 112, consists of a double-sideband AM modulated carrier.

Figure 2:
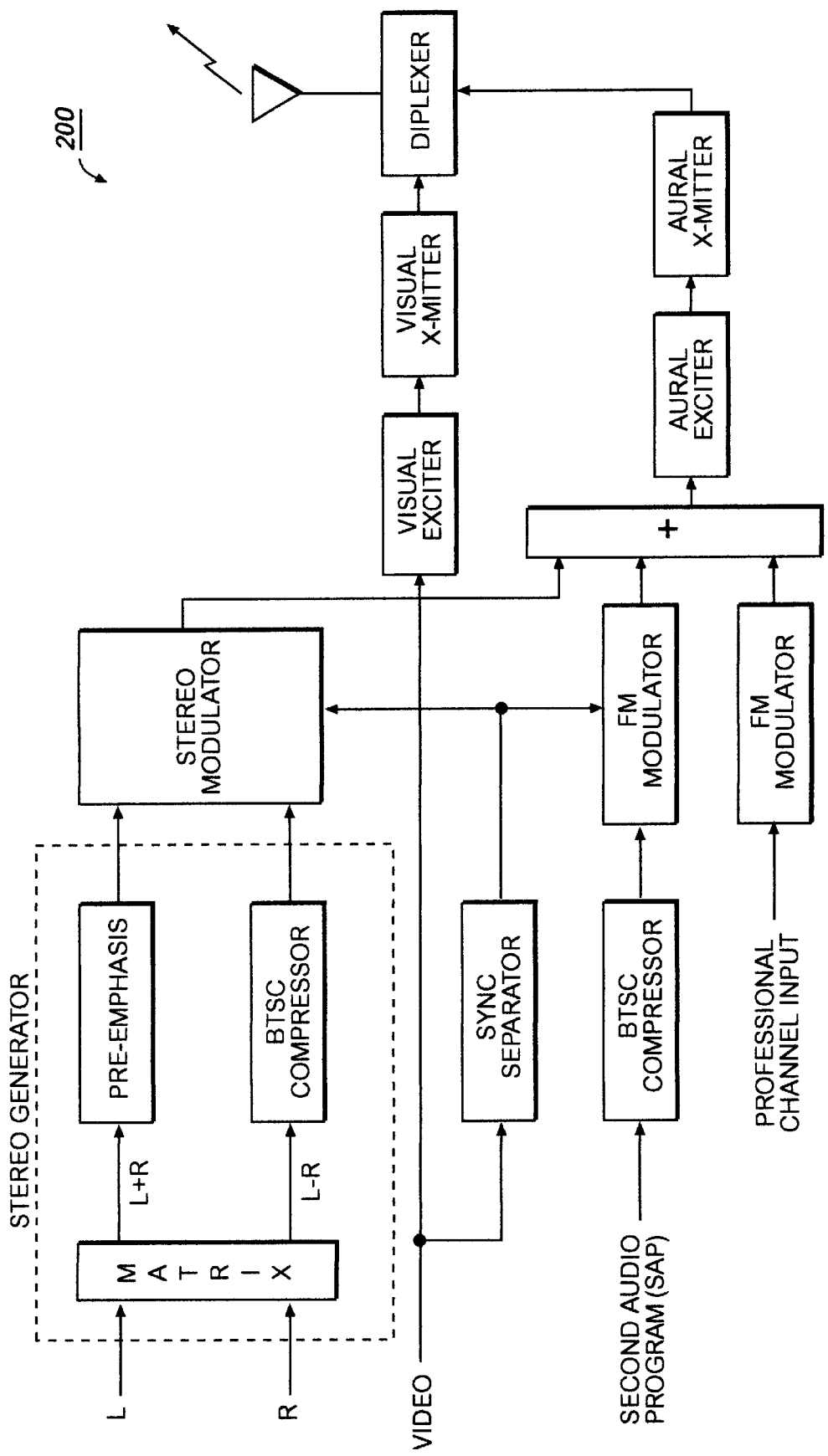
FIG. 2 is a block diagram of a television transmitter system as defined in the MTS Standard.
Figure 3:
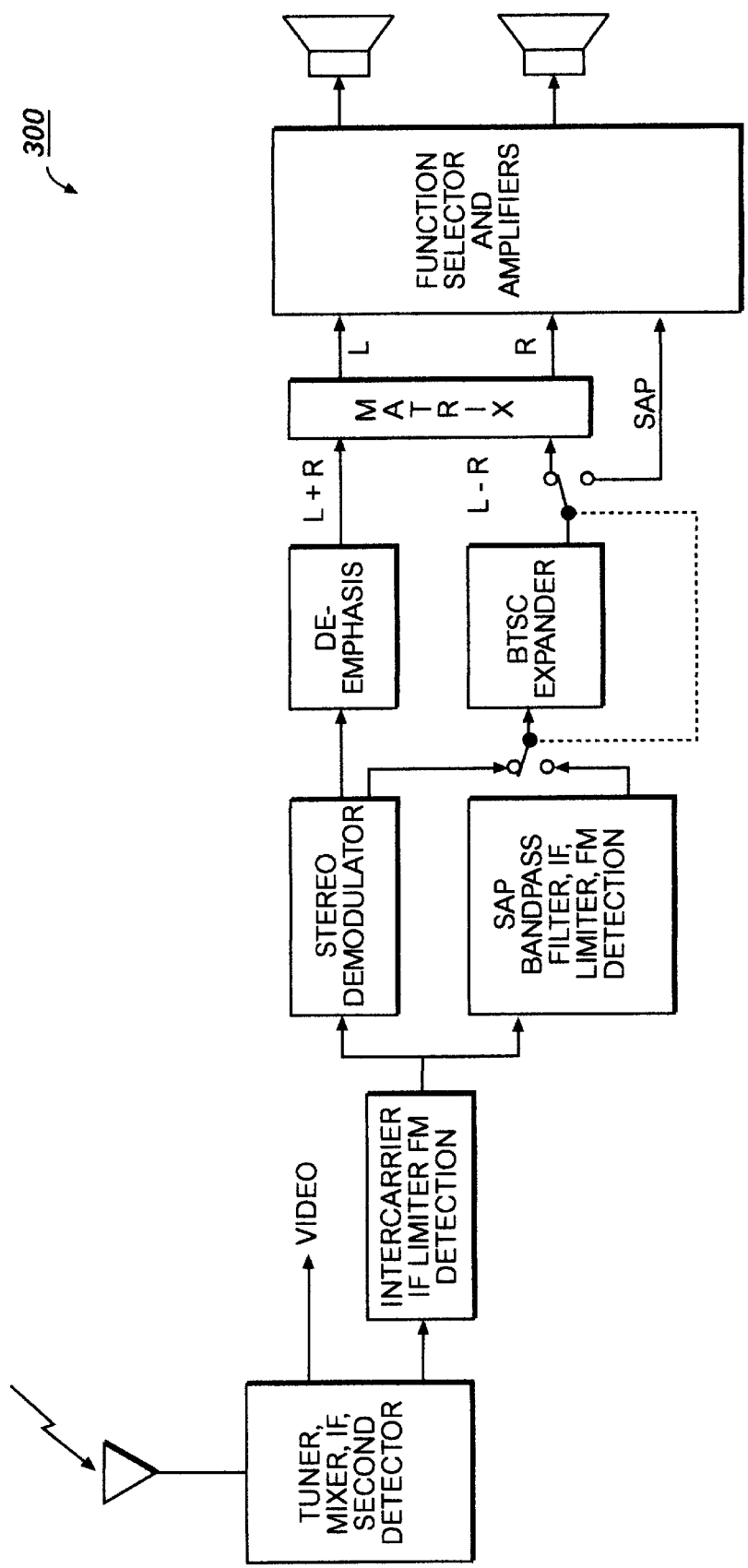
FIG. 3 is a block diagram of a television receiver system as defined in the MTS Standard.

FIG. 2 is a functional block diagram of the BTSC compatible television transmitter 200, and FIG. 3 is functional block diagram of a corresponding BTSC compatible television receiver 300. The transmitter of FIG. 2 and the receiver of FIG. 3 could be employed in both existing devices and the present invention.

Referring to FIG. 1 and Table 1, the main-channel aural-carrier modulation consists of an (L+R) audio signal subjected to 75 $\mu$s preemphasis. The (L–R) audio signal is subjected to compression, that is, the transmitter part of the companding system that includes complementary expansion in the receiver. The compressed (L–R) signal causes double-sideband, suppressed-carrier amplitude modulation of a sub-carrier at 2 $f_H$ where $f_H$ is the transmitted picture horizontal scanning frequency, 15.794 KHz. The audio bandlimits of both preemphasized (L+R) and of encoded (L–R) are 50 Hz and 15 KHz. The main channel peak deviation is 25 KHz. The stereophonic subchannel peak deviation is 50 KHz. For statistically independent L and R, the combined peak deviation of the main channel and the stereophonic subchannel is also 50 KHz with full interleaving. When L and R signals are not statistically independent or when (L+R) and (L–R) signals do not have matching pre-emphasis characteristics, as when (L–R) is compressed, the combined deviation of main channel and stereophonic subchannel is constrained to 50 KHz.

Figure 4:
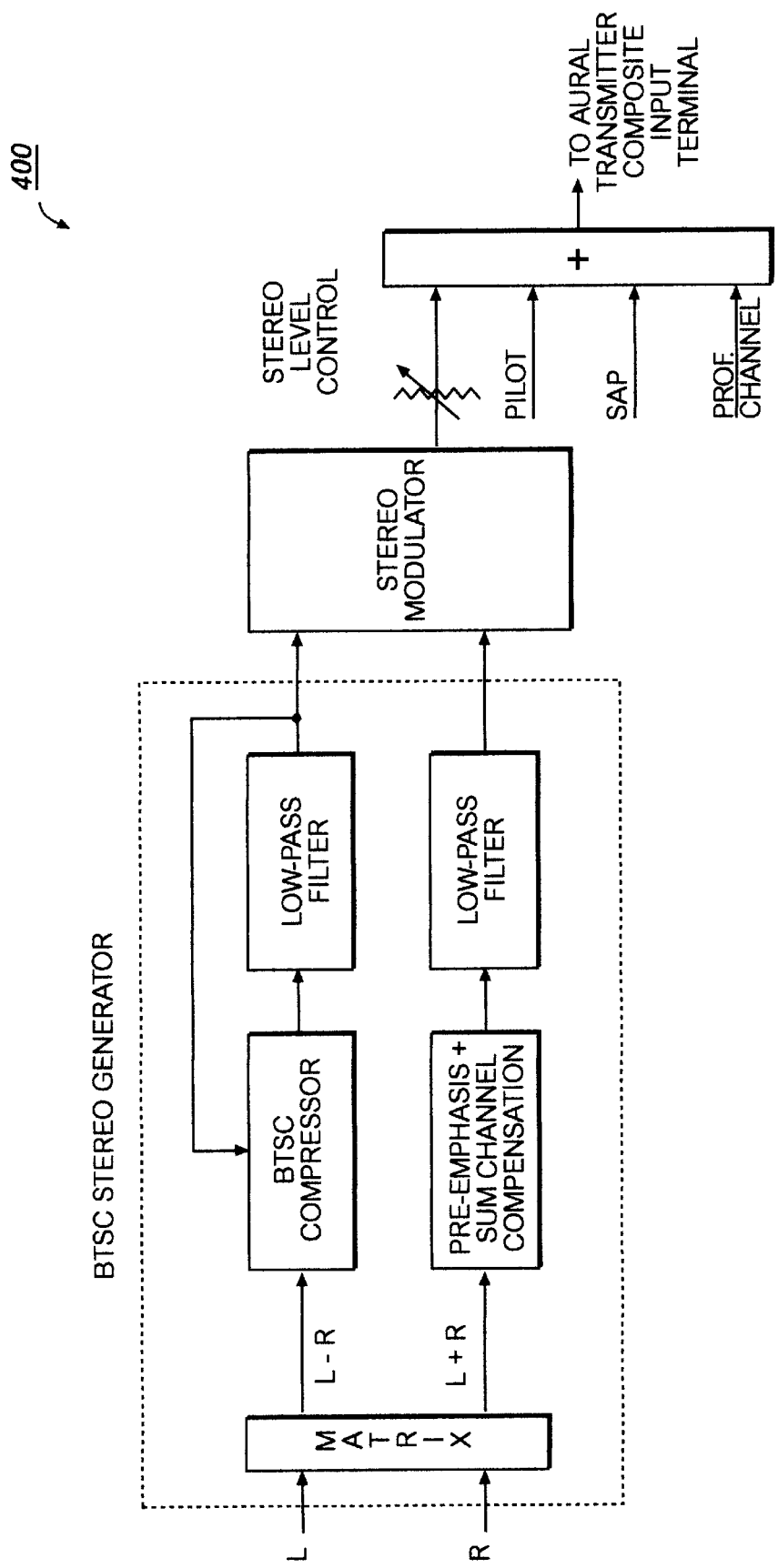
FIG. 4 illustrates the calibration block diagram of a BTSC Stereo Generator, as defined in the MTS Standard.

FIG. 4 illustrates the calibration block diagram of a BTSC Stereo Generator 400, as defined in the MTS Standard. This block diagram relates to both existing system and to systems in accordance with the invention.

TABLE 1

AURAL CARRIER MODULATION STANDARDS
AURAL CARRIER MODULATION STANDARDS

| Service or Signal | Modulating Signal | Modulating Frequency Range KHz | Audio Processing or Pre-emphasis | Subcarrier Frequency $f_H$* | Subcarrier Modulation Type | Subcarrier Deviation KHz | Aural Carrier Peak Deviation KHz |
|---|---|---|---|---|---|---|---|
| Monophonic | L + R | 0.05–15 | 75 μsec | | | | 25** |
| Pilot | | | | $f_H$ | | | 5 |
| Stereophonic | L – R | 0.05–15 | BTSC Compression | 2 $f_H$ | AM-DSB SC | | 50** |
| Second Program | | 0.05–10 | BTSC Compression | 5 $f_H$ | FM | 10 | 15 |
| Professional Channel | Voice or Data | 0.3–3.4 0–1.5 | 150 μsec 0 | 6.5 $f_H$ | FM FSK | 3 | 3 |
| | | | | | TOTAL | | 73 |

*$f_H$ = 15.734 KHz
**Sum does not exceed 50 KHz

BTSC ENCODER—HARDWARE

Figure 5:
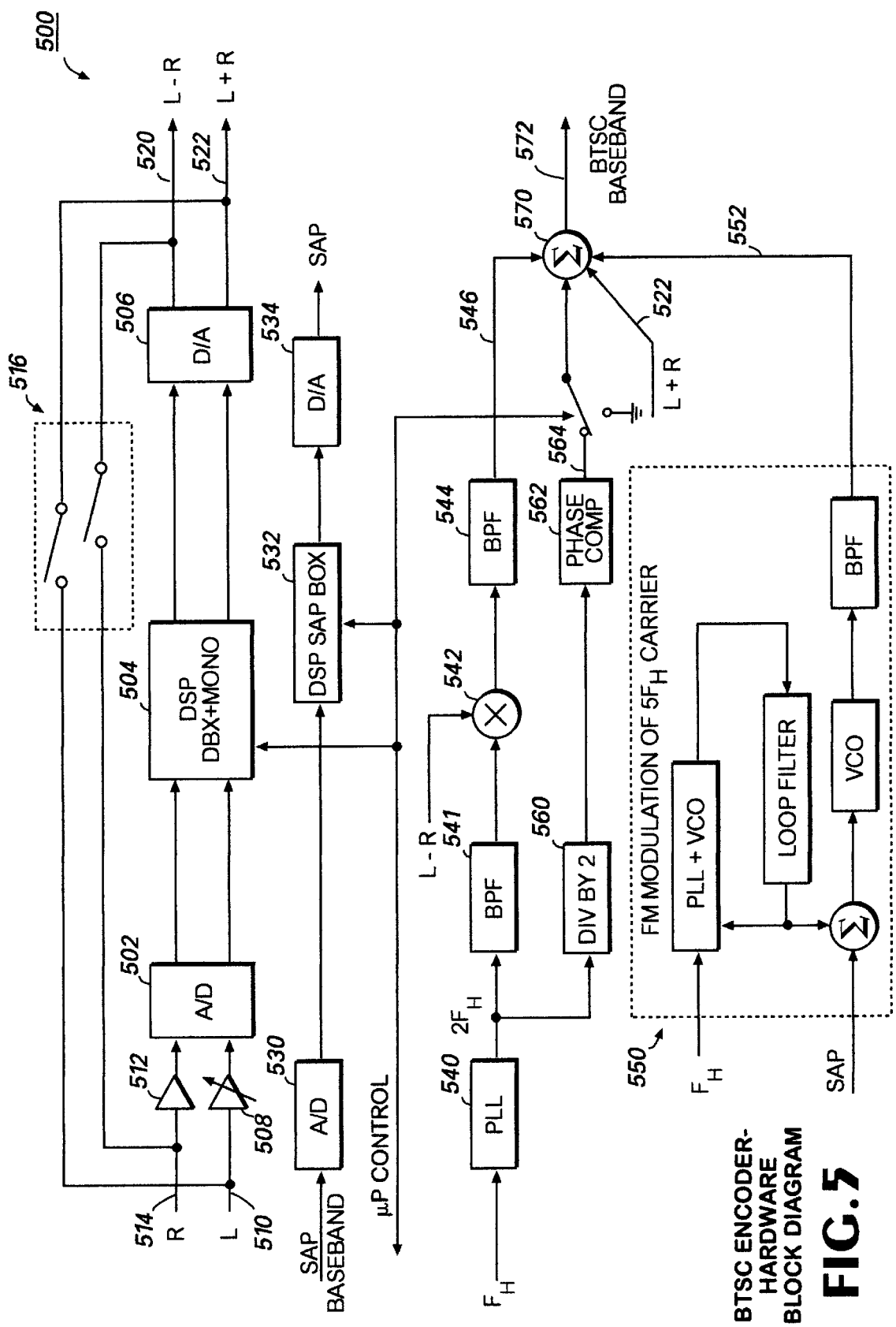
FIG. 5 illustrates a hardware block diagram for the BTSC encoder in accordance with the invention.

FIG. 5 illustrates a hardware block diagram 500 for the BTSC encoder in accordance with the invention. The BTSC encoder hardware comprises an input stereo analog-to-digital converter (A/D) 502, a digital signal processing (DSP) unit 504, an output stereo digital-to-analog converter (D/A) 506, a variable gain amplifier 508 in the left (L) input channel 510 to the input stereo A/D 502, a fixed gain amplifier 512 in the right (R) input channel 514 to the input stereo A/D 502, and switching circuit 516 to switch the feedback loop from the output stereo D/A 506 to the input stereo A/D 502. The fixed gain amplifier 512 and the variable gain amplifier 508 may be interchanged to achieve the function described below.

The input stereo A/D 502 comprises two internal A/D converters (not shown), one each to digitize the left and right audio input channels. The internal A/D converters are matched, within a manufactured specified tolerance. A sixteen bit A/D provides enough headroom for occasional high input signal peaks and provides a clean representation of the input signal over its entire dynamic range. Sixteen bit stereo A/Ds are high volume components found in almost every multimedia system. A sampling rate of at least 48 KHz is recommended to minimize the interpolation requirement of the DSP 504.

The DSP 504 uses digital processing techniques to implement the BTSC encoding, matrix, and preemphasis algorithms, as required by the BTSC standard and further described in OST 60. Either an off-the-shelf DSP processor, or an ASIC are adequate for this application. Off-the-shelf processors such as the Motorola's 56002, or Texas Instruments C5X, or C3X are adequate for the current needs of this applications. The invention, in one embodiment was implemented with satisfactory results using a Motorola 56002. Most DSP processors provide a simple interface to both the stereo A/D and stereo D/A.

The output stereo D/A 506 is usually at least a sixteen bit stereo component. As in the case of the input stereo A/D, the output stereo D/A 506 comprises two internal D/A converters (not shown), matched to one another within a manufactured specified tolerance. Sixteen bits allows a clean representation of the L+R and L–R signals over the entire dynamic range of the output signal. This ensures that the resultant signal to noise of the entire encoder/decoder system will suffer minimal degradation by the quantization noise of the AD. Recommended practice is that all BTSC subchannels reject out-of-band signals by at least 60 dB. A sixteen bit D/A ensures that the quantization noise floor is lower than 80 dB when a 100% modulation signal is at the output. The D/A has the same 48 KHz sample clock as the stereo A/D.

L–R 520 and L+R 522 signals are sampled from the output stereo D/A 506 and conducted back to the input stereo AID 502, thus providing a feedback loop. This feedback loop, in conjunction with the fixed and variable gain is used during initialization/calibration to align or calibrate the input and output signals, thereby compensating for interchannel gain mismatches between the internal A/D 502 and D/A 506 converters and further compensating for upstream mismatches in the L and R channels. During initialization/calibration, the D/A outputs are fed back to the A/D inputs, while the DSP puts out a test tone to each channel, allowing the DSP 504 to adjust the absolute output levels.

FIG. 5 also shows a single channel A/D 530 followed by a DSP 532 and a single channel D/A 534. This is for SAP audio channel encoding. The SAP encoder DSP 532 utilizes an identical algorithm to that used on the L–R signal.

FIG. 5 also shows a PLL 540 which generates a $2 \times F_H$ signal, where $F_H$ is the video horizontal synch frequency. The $2 \times F_H$ signal is mixed 542 with L–R and filtered using a band-pass filter (BFP) 544. This generates the stereo subchannel signal 546.

FIG. 5 also shows an FM modulator 550 which takes the $F_H$ and compressed SAP as an input and modulates a $5 \times F_H$ carrier with the compressed SAP. This generates the SAP channel signal 552.

FIG. 5 also shows a divide by two circuit 560 with a phase compensator 562. This generates the $F_H$ pilot signal 564 and ensures that it is in phase with the $2 \times F_H$ AM carrier.

A summer 570 creates the composite BTSC signal 572 by summing baseband L+R 522, pilot 564, stereo subchannel 546, and SAP channel 552.

DSP ALGORITHMS

Figure 6:
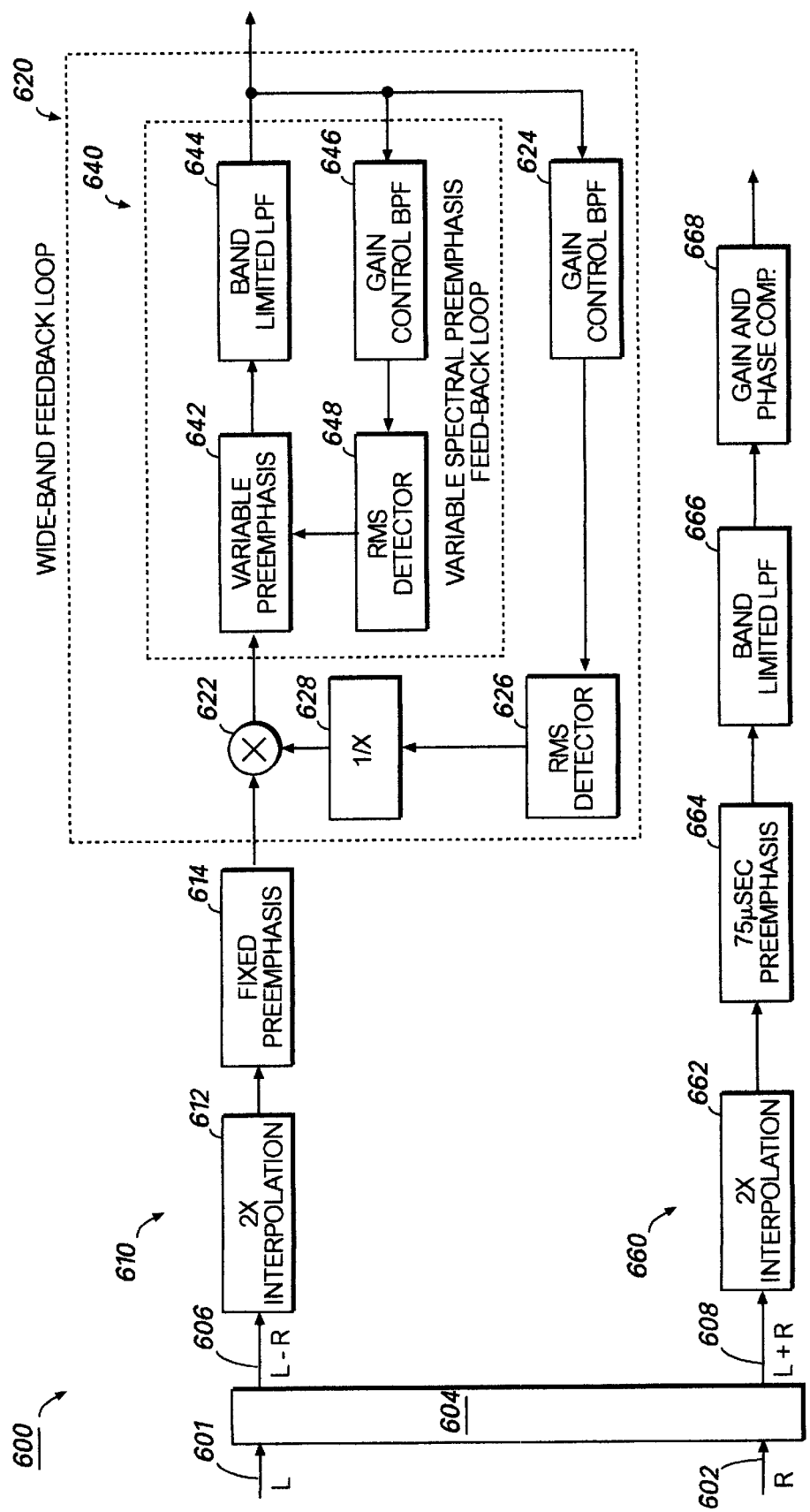
FIG. 6 illustrates an algorithm block diagram for the BTSC encoder in accordance with the invention, for the L–R and L+R channels.

FIG. 6 shows a algorithm block diagram 600 of the DSP (item 504 in FIG. 5) processing for the L–R channel 606 and the L+R channel 608. The left audio input 601 and the right audio input 602 are sampled by an A/D converter (item 502 in FIG. 5). The algorithm for the L–R channel 606 comprises the downstream process of L–R channel 610, the wide-band feedback loop 620 and the variable spectral preemphasis feedback loop 640, often referred to as the wideband compressor and the spectral compressor respectively. The algorithm of the L+R channel 608 simply comprises the downstream process 660.

The first stage of processing is with a matrix 604. The matrix 604 calculates values for L–R 606 and L+R 608 based on the L input 601 and the R input 602. The matrix operation is performed utilizing the DSP provided precision adder.

The next stage is 2× interpolation 612 and 662, that is, interpolation at twice the sample rate. This 2× interpolation 612 and 662 is necessary since bilinear transformation, discussed below, is used to model the ideal BTSC continuous time transfer functions specified in OST-60. As the frequency increases, the accuracy of the bilinear transformation decreases. A minimum sampling rate of 96 KHz is recommended to maintain reasonable accuracy up to 14 KHz the upper audio frequency of interest. Alternatively, a frequency dependent sampling at an approximate rate of seven times the desired frequency may be used. Because the ideal analog filters are transformed to digital filters by using the bilinear transformation, the sample rate must be increased to 96 KHz to provide a good match, in the filter response, up to 14 KHz.

The interpolating filter used in the 2× interpolation 612 and 662 is a finite impulse response (FIR) filter having the following transfer function:

$$H(z) = \sum_{m=0}^{m=n} h(m) z^{-m} \quad (1)$$

Where h(m) is the mth coefficient of an nth order filter. The theory of interpolating filters is well established. To prevent degradation of the input signal, the interpolating filter should provide more than 80 dB rejection of the spectral component symmetrical about 48. Also, passband ripple should be minimized to reduce frequency response degradation of the entire system. In the implementation of this invention, a 52nd order filter was used with the following coefficients:

| | |
|---|---|
| h(0) = −0.0000915527 = h(52) | h(14) = −0.0083465576 = h(38) |
| h(1) = −0.0004730225 = h(51) | h(15) = −0.0141448975 = h(37) |
| h(2) = −0.0007476807 = h(50) | h(16) = 0.0102386475 = h(36) |
| h(3) = 0.0000610352 = h(49) | h(17) = 0.0221557617 = h(35) |
| h(4) = 0.0012512207 = h(48) | h(18) = −0.0120239258 = h(34) |
| h(5) = 0.0003051758 = h(47) | h(19) = −0.0344543457 = h(33) |
| h(6) = −0.0021514893 = h(46) | h(20) = 0.0135955811 = h(32) |
| h(7) = −0.0011444092 = h(45) | h(21) = 0.0553588867 = h(31) |
| h(8) = 0.0033416748 = h(44) | h(22) = −0.0148162842 = h(30) |
| h(9) = 0.0026245117 = h(43) | h(23) = −0.1009368896 = h(29) |
| h(10) = −0.0048065186 = h(42) | h(24) = 0.0155944824 = h(28) |
| h(11) = −0.0050354004 = h(41) | h(25) = 0.3165588379 = h(27) |
| h(12) = 0.0065155029= h(40) | h(26) = 0.4841461182 = h(26) |
| h(13) = 0.0087127686 = h(39) | |

The above coefficients define a linear phase symmetrical FIR filter. Since the interpolating filter has a 96 KHz sampling rate, every other input sample is zero. As a result only every other coefficient is used at any given time in the actual implementation. This results in two subfilters which are alternately used at each ⅟96000 second time interval.

Still referring to FIG. 6, the next stage of processing in the L–R downstream process 610 is the fixed preemphasis filter 614. The fixed preemphasis filter is defined in OST-60 as having the following continuous time transfer function:

$$F(f) = \frac{(jf/0.408)+1}{(jf/5.23)+1} * \frac{(jf/2.19)+1}{(jf/62.5)+1} \quad (2)$$

Where f is in KHz.

Since the subject invention employs a digital implementation of the BTSC analog encoding, the s-plane Laplace transform must be converted to a z-plane (discrete) transform. Conversion to a Laplace transform is achieved by substituting f=s/j(2*π). The bilinear transform is well known. The bilinear transform maps the s-plane into the z-plane by equation (3).

$$H(z) = H(s) \quad \text{where} \quad s = 2f_s \frac{z-1}{z+1} \quad (3)$$

Using equation (3), the bilinear transformation of equation (2) results in a second order IIR filter of the form shown in equation (4).

$$H(z) = \frac{b(1) + b(2)z^{-1} + b(3)z^{-2}}{1 + a(2)z^{-1} + a(3)z^{-2}} \quad (4)$$

with coefficients:

| | | |
|---|---|---|
| b(1) = 1 | b(2) = −1.839891732 | b(3) = 0.843416111 |
| a(2) = −0.38054776 | a(3) = −0.231576235 | |

The filter is scaled as it was used in the recommended implementation. Other gain scaling is possible.

Figure 8:
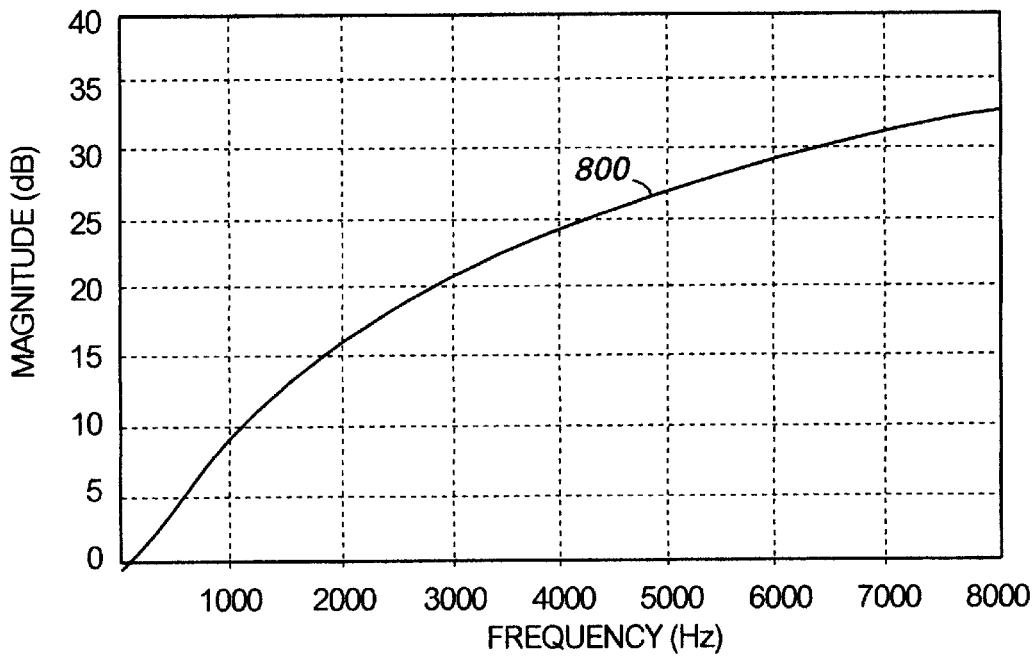
FIG. 8 is a superposition of the magnitudes of BTSC Standard's required Laplace transforms for a fixed preemphasis filter, and the z-transform obtainable with the subject invention.
Figure 9:
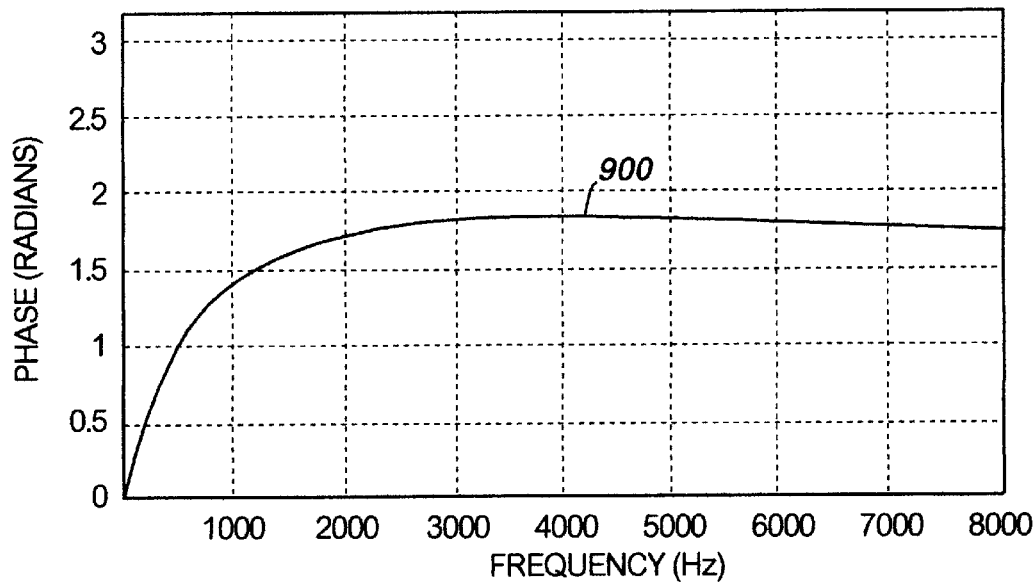
FIG. 9 is a superposition of the phase for BTSC Standard's required Laplace transforms for a fixed preemphasis filter, and the z-transform obtainable with the subject invention.

FIG. 8 shows a plot 800 of the magnitude of the OST-60 required Laplace transform and the z-transforms for the fixed preemphasis filter using the method in accordance with the invention. FIG. 9 shows a plot 900 of the phase of the OST-60 required Laplace transform and the z-transforms for the fixed preemphasis filter using the method in accordance with the invention. In both FIGS. 8 and 9, the error between the Laplace and Z-transforms is so small that the plots are practically superimposed.

Figure 10:
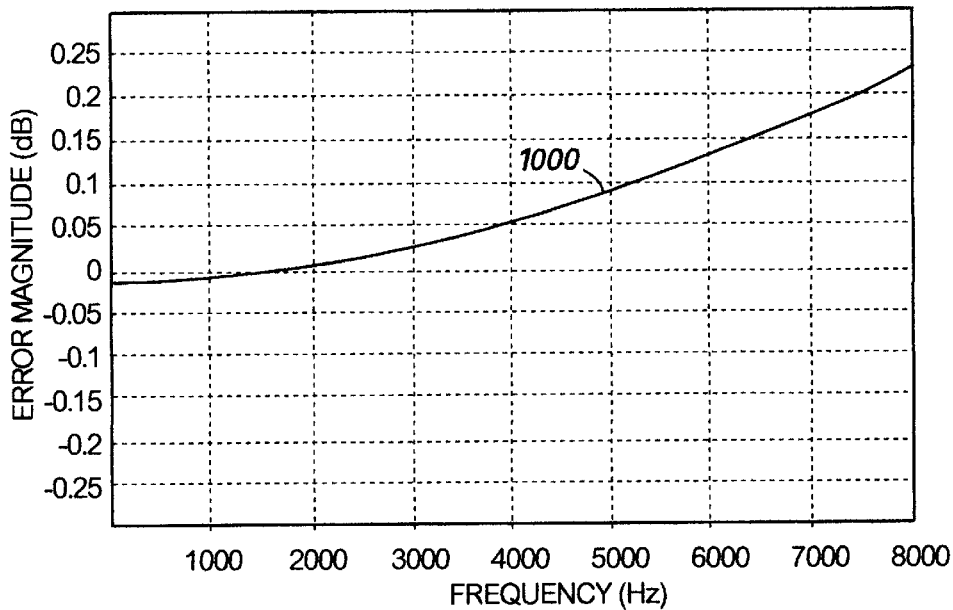
FIG. 10 is a plot of the magnitude error of BTSC Standard's required Laplace transforms for a fixed preemphasis filter, and the z-transform obtainable with the subject invention.

To appreciate the accurate results in accordance with the invention, FIG. 10 is a plot 1000 of the error magnitude between the OST-60 required Laplace transforms and subject invention's z-transforms for the fixed preemphasis filter.

Referring to FIGS. 8 and 10, it is seen that for the frequency range up to 8 KHz, empirical results show that the error is small enough to maintain stereo separation greater than 30 dB at 8 KHz. Though not shown, the invention results in an error of 0.634 dB at 14 KHz, which is small enough to maintain stereo separation greater than 22 dB. These results compare favorably with the FCC requirements of 30 and 20 dB respectively at 10% 75 μsec equivalent input modulation. Furthermore, the resulting accuracy of the invention is obtainable in production quantities, as there is no variation from one product to another.

Figure 11:
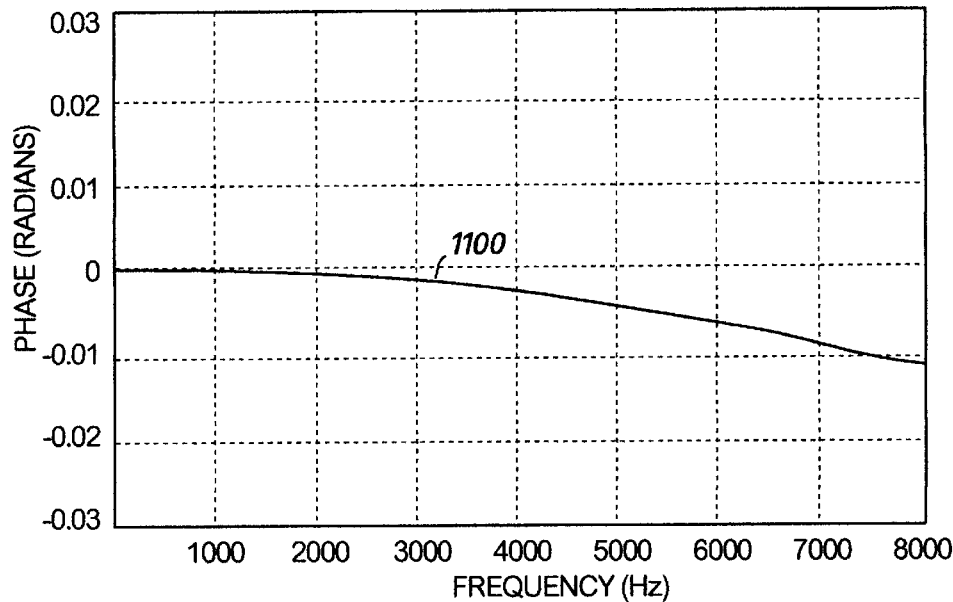
FIG. 11 is a plot of the phase error of BTSC Standard's required Laplace transforms for a fixed preemphasis filter, and the z-transform obtainable with the subject invention.

FIG. 11 is a plot 1100 of the phase error between the OST-60 required Laplace transform and the z-transform for the fixed preemphasis filter using the method in accordance with the invention. Up to 8 KHz, the maximum phase error is approximately 0.01 radians, or approximately 0.6 degrees.

Returning to FIG. 6, the next stage of processing in the L–R downstream process 610 is the wideband gain multiplier 622. The multiplication factor is controlled by the wideband gain feedback loop 620, a function preferably implemented by a high precision multiplier in a fixed or floating point DSP chip.

The next stage of processing in the downstream process is the variable preemphasis filter 642. The transfer function of the variable preemphasis filter is determined by the variable preemphasis feedback factor b. The continuous time transfer function of the variable spectral preemphasis filter is defined by OST-60 and is given by equation (5).

$$S(f, b) = \frac{1 + (jf/20.1)(b+51)/(b+1)}{1 + (jf/20.1)(1+51b)/(b+1)} \quad (5)$$

The bilinear transform of the variable preemphasis filter, at $F_s$=96000 Hz, is given by equation (6).

$$\frac{(1 + AC)/(1 + BC) - ((AC-1)/(1 + BC))z^{-1}}{1 - ((BC-1)/(1 + BC))z^{-1}} \quad (6)$$

where A=(b+51)/(b+1), B=(1+51b)/(b+1) and C=1.260717618

Figure 12:
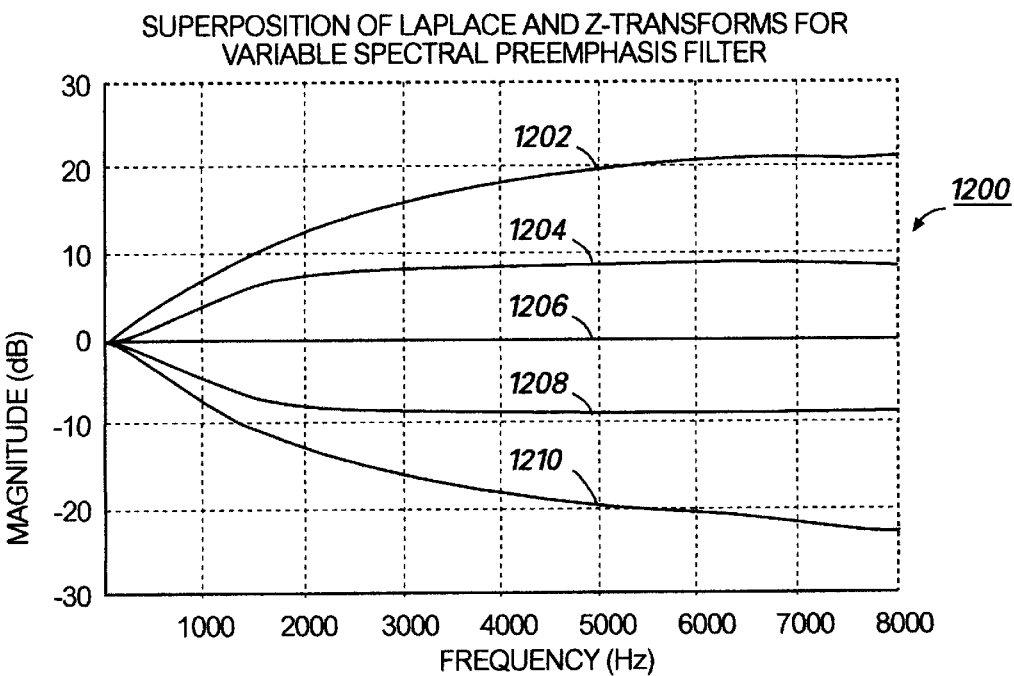
FIG. 12 is a superposition of the magnitudes of BTSC Standard's required Laplace transforms for a variable spectral preemphasis filter, and the z-transform obtainable with the subject invention.

All filter coefficients are calculated using multiplication and division instructions provided by DSP chips. FIG. 12 shows the plots 1200 of the OST-60 required Laplace and z-transforms of the variable spectral preemphasis filter using the method in accordance with the invention. In FIG. 12, from top to bottom, the plots correspond to values of b=0.03162 1202, 0.3162 1204, 1.0 1206, 3.162 1208, and 31.62 1210. Again, the error between the Laplace and Z-transforms is so small that the two plots are practically superimposed on each other.

Figure 13:
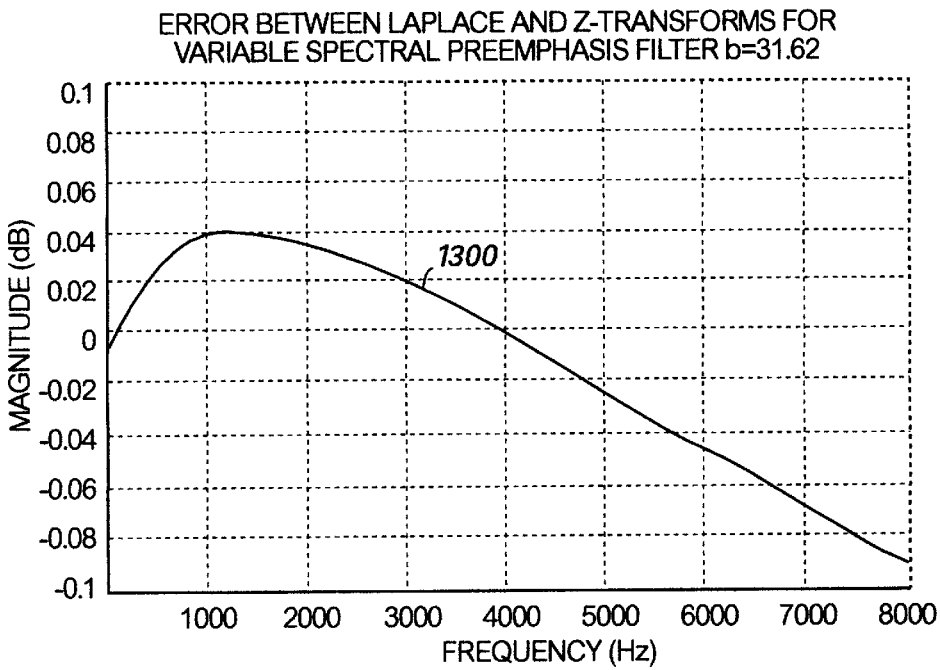
FIG. 13 is a plot of the magnitude error of BTSC Standard's required Laplace transforms for a variable spectral preemphasis filter for b=31.62 obtainable with the subject invention.

FIG. 13 is a plot 1300 of the magnitude error between the OST-60 required Laplace and z-transforms of the variable spectral preemphasis filter using the method in accordance with the invention for a value of b=31.62.

Figure 14:
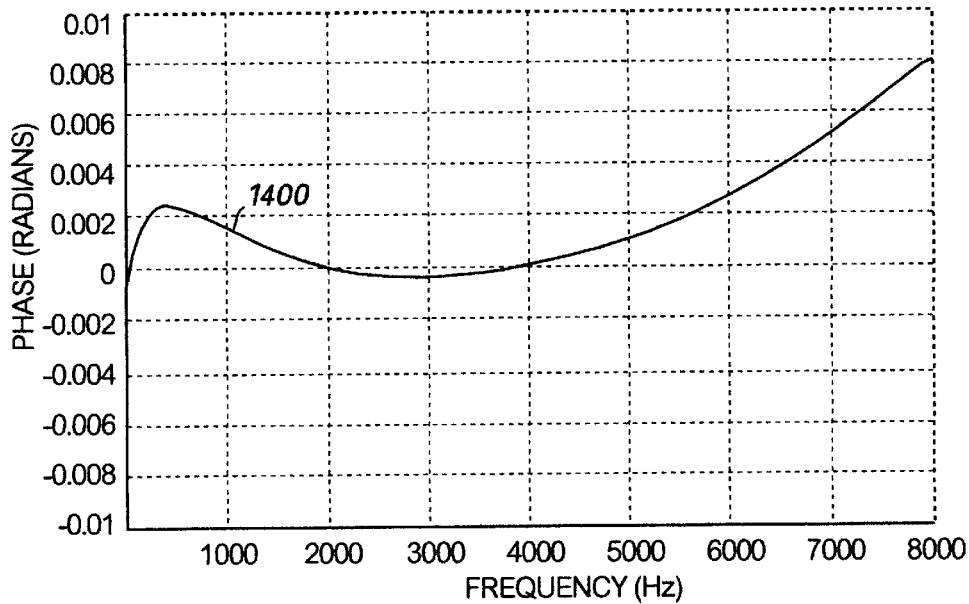
FIG. 14 is a plot of the phase error of BTSC Standard's required Laplace transforms for a variable spectral preemphasis filter for b=31.62 obtainable with the subject invention.

FIG. 14 is a plot 1400 of the phase error between the OST-60 required Laplace and z-transforms of the variable spectral preemphasis filter using the method in accordance with the invention for a value of b=31.62.

Figure 16:
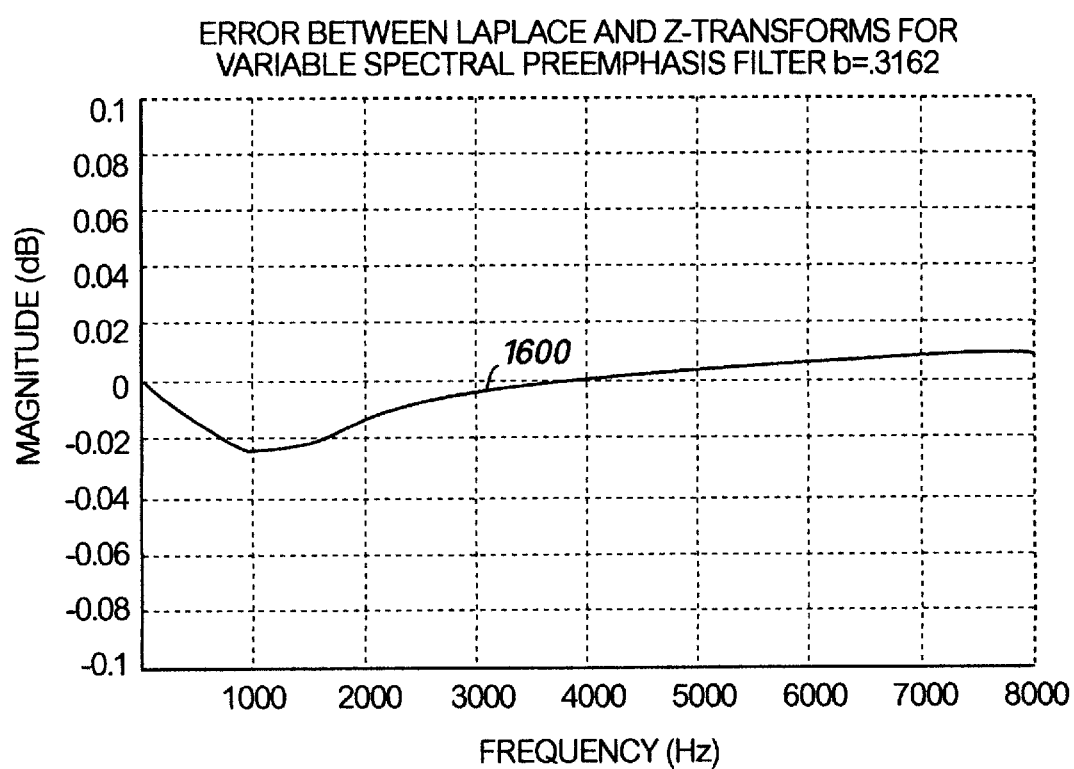
FIG. 16 is a plot of the magnitude error of BTSC Standard's required Laplace transforms for a variable spectral preemphasis filter for b=0.3162 obtainable with the subject invention.

FIG. 16 is a plot 1600 of the magnitude error between the OST-60 required Laplace and z-transforms of the variable spectral preemphasis filter using the method in accordance with the invention for a value of b=0.3162. A plot of the errors for other b values is not shown, however, the errors are in the same order of magnitude as for of b=0.3162.

Though not shown, the subject invention results in an error of 0.0084 dB at 14 KHz, which empirically results in FCC compliant stereo separation. As discussed above for other processing stages, the above results are achieved without going through a process of component selection or component matching, and the results are independent of component or manufacturing tolerances.

Figure 15:
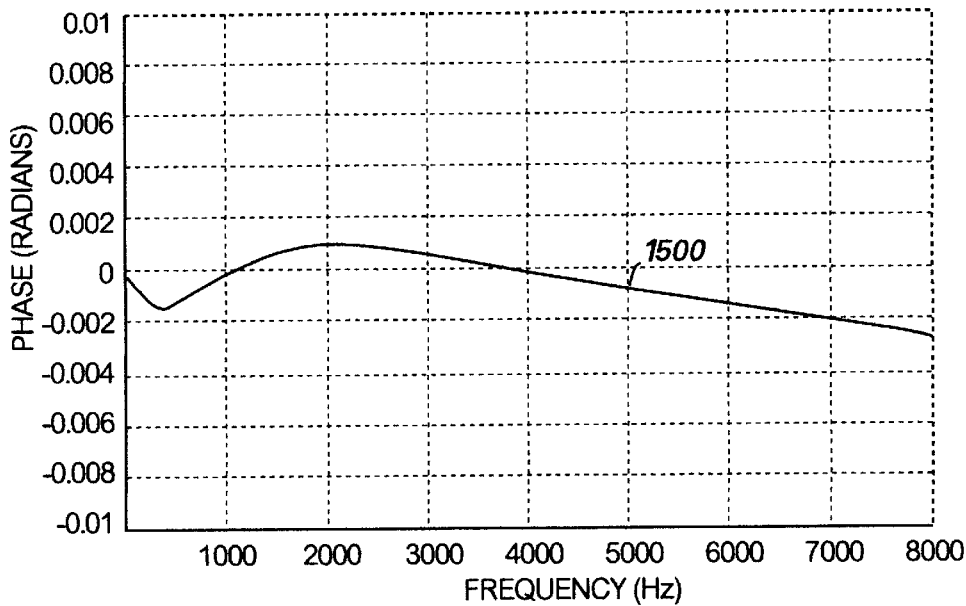
FIG. 15 is a plot of the phase error of BTSC Standard's required Laplace transforms for a variable spectral preemphasis filter for b=0.3162 obtainable with the subject invention.

FIG. 15 is a plot 1500 of the phase error between the OST-60 required Laplace and z-transforms of the variable spectral preemphasis filter using the method in accordance with the invention for a value of b=0.3162. A plot of the errors for other b values is not shown, however, the errors are in the same order of magnitude as for of b=0.3162. Up to 8 KHz, the maximum phase error is approximately 0.002 radians, or approximately 0.1 degrees.

Returning to FIG. 6, the next stage of processing in the downstream L–R process is the band-limiting lowpass filter 644, which band-limits the signal prior to output and feedback. This filter is specified by OST-60 as having following stopband characteristics:

| | |
|---|---|
| 15,734 (pilot frequency) | −60 dB |
| 16,468 | −43 dB |
| 16,468–31,468 | −43 dB to −60 dB |
| 31,468–120,000 | −60 dB |

In its passband, 0 to 14 KHz, the band limiting lowpass filter's 644 ripple should be minimal to avoid degrading the audio band. In the implementation in accordance with the invention, a 12th order elliptic digital filter was used for this purpose. In one embodiment, the filter 644 consisted of six cascaded second order IIR sections of the type described by equation (4).

The wideband gain multiplier 622 receives a multiplication factor from the wide-band feedback loop 620, discussed below. The wideband gain factor adjustment results in a compression factor of approximately 2 to 1 for frequencies below 5 KHz. The output of the fixed preemphasis filter 614 is multiplied by the multiplication factor 629 and supplied to the variable preemphasis stage 642, where a frequency dependent variable preemphasis is applied to the signal. The variable preemphasis, when combined with the wideband gain adjustment results in a compression factor of approximately 3 to 1 for frequencies above 5 KHz. The signal is then fed to the band limited lowpass filter 644 to eliminate any enhanced frequencies above 15 KHz prior to feedback and transmission. Every other sample is now passed to the D/A (item 506 in FIG. 5) for transmission over the appropriate media. The band limited lowpass filter 644 output is also provided as the input to both feedback loops 620 and 640.

Wide-Band Feedback Loop

Still referring to FIG. 6, and turning now to the wide-band feedback loop 620 (the wideband compressor), the first stage of the wideband gain feedback loop is the gain control BPF 624. The gain control BPF 624 is defined by OST-60 to have the transfer function defined in equation (7).

$$F(f) = \frac{(jf/0.0354)}{((jf/0.0354) + 1)((jf/2.09) + 1)} \quad (7)$$

A bilinear transform was performed on this transfer function to convert from analog s-plane Laplace transform to a discrete z-plane transform. In addition, an empirically developed compensation network was added to the gain control BPF of equation (7), resulting in the 3rd order IIR filter of the form shown by equation (8). The coefficients b(4), b(5) and a(4) in the right hand side of equation (8) were developed empirically and resulted in improved gain and phase response.

$$H(z) = \frac{b(1) + b(2)z^{-1} + b(3)z^{-2}}{1 + a(2)z^{-1} + a(3)z^{-2}} * \frac{b(4) + b(5)z^{-1}}{1 + a(4)z^{-1}} \quad (8)$$

where f is expressed in KHz, and with coefficients:

| | | |
|---|---|---|
| b(1) = 1 | b(2) = 0 | b(3) = −1 |
| b(4) = 1 | b(5) = 0.109999999 | |
| a(2) = −1.869665861 | a(3) = 0.869962141 | a(4) = 0.800000012 |

The filter is scaled depending upon the specific application. Other gain scaling is possible.

The next stage in the wideband gain feedback loop is the root-mean-square (rms) detector 626. The rms detector 626 produces an estimate of the rms voltage in the signal provided at its input. The rms detector consists of 3 stages: a squarer, to convert voltage to power; an integrator with a 34.7 msec. time constant; and a square root function, to convert power back to voltage. The squarer is simply implemented utilizing the precision multiplier on the DSP chip. The integrator was modeled as a first order IIR filter of the form shown by equation (9).

$$H(z) = \frac{b(1) + b(2)z^{-1}}{1 + a(2)z^{-1}} \quad (9)$$

with coefficients:

| | | |
|---|---|---|
| b(1) = 0.150073533E − 03 | b(2) = 0.150073533E − 03 | a(2) = −0.999699853 |

The filter is scaled as it was used in the recommended implementation. Other gain scaling is possible.

This filter results in a release rate of 125 dB/second corresponding to 34.7 msec time constant. The BTSC encoding standard specifies a release rate of 125 dB + or − 5%. Meeting this release rate requirement is critical as it allows the decoder to track the encoder when in transition. A digital implementation allows this release rate requirement to be met almost exactly. This specification is not subject to the component tolerances, environmental effects, and unit variances that effect existing systems.

The square root is implemented via the series expansion shown in equation (10). The embodiment of this invention used the first 30 terms of this series.

$$\sqrt{1-x} = \qquad (10)$$
$$1 - \frac{1}{2}x - \frac{1 \cdot 1}{2 \cdot 4}x^2 - \frac{1 \cdot 1 \cdot 3}{2 \cdot 4 \cdot 6}x^3 - \frac{1 \cdot 1 \cdot 3 \cdot 5}{2 \cdot 4 \cdot 6 \cdot 8}x^4 - \ldots$$
for $|x| \leq 0$ The last stage of the wideband gain feedback loop is the 1/x function 628. This function is performed utilizing a divide iteration instruction on a DSP chip.

The wideband gain feedback loop 620 samples the output of the downstream process 610 of L−R channel, the gain control bandpass filter 624 filters the output to eliminate the high frequency components and allows the wideband gain loop to sense the low and mid frequency energy. The output of the gain control filter 624 is now provided to the rms detector 626 which determines the rms equivalent voltage of the input signal. The rms detector output is fed to the 1/x function 628. The output of the 1/x function 628 is the multiplication factor supplied to the wideband gain multiplier 622, which controls the wide band gain adjustment as a function of the rms voltage in the low and mid frequency range of the encoder output signal.

Variable Spectral Preemphasis Feedback Loop

Still referring to FIG. 6, and turning now to the variable spectral preemphasis feedback loop 640 (also referred to herein as "the spectral compressor"), the first stage of the spectral compressor 640 is a gain or spectral control band pass filter (BPF) 646. OST-60 gives the continuous time transfer function for the spectral control BPF as shown in equation (11).

$$Q(f) = \frac{(jf/5.86)^3}{((jf/7.6)^2 + (jf/7.31) + 1) \cdot ((jf/26.9) + 1) \cdot ((jf/3.92) + 1)} \quad (11)$$

A bilinear transform was performed on this transfer finction to convert from analog s-plane Laplace transform to a discrete z-plane transform. In addition, an additional empirically developed compensation network was added to give a 6th order IIR filter implemented with three cascaded second order sections of the form shown by equation (4). The coefficients for the cascaded second order sections were developed empirically and resulted in improved gain and phase response.

Coefficients for the first cascade section:

| | | |
|---|---|---|
| b1(1) = 0.754440784 | b1(2) = −0.150888205E + 01 | b1(3) = 0.754440784 |
| a1(2) = −0.141406798E + 01 | a1(3) = 0.603694975 | |

Coefficients for the second cascade section:

| | | |
|---|---|---|
| b2(1) = 0.414929807 | b2(2) = 0 | b2(3) = −0.414929807 |
| a2(2) = −0.836243689 | a2(3) = 0.491550192E − 01 | |

Coefficients for the third cascade section:

| | | |
|---|---|---|
| b3(1) = 1 | b3(2) = 0.899999976 | b3(3) = 0.202500001 |
| a3(2) = 0.4 | a3(3) = 0.399999991E − 01 | |

The filter is scaled as it was used in the recommended implementation. Other gain scaling is possible.

The next stage in the spectral compressor 640 is the rms detector 648, which produces an estimate of the rms voltage in the signal provided at its input. Similar to wideband gain feedback loop, the rms detector consists of 3 stages. The three stages are a squarer, to convert voltage to power; an integrator with an 11.4 msec. time constant; and a square root function to convert power back to voltage. The squarer is simply implemented utilizing the precision multiplier on the DSP chip. The integrator was modeled as a first order IIR filter of the form shown by equation (9), with coefficients:

| | | |
|---|---|---|
| b(1) = 1 | b(2) = 1 | a(2) = −0.999086675 |

The filter is scaled as it was used in the recommended implementation. Other gain scaling is possible. This filter results in a release rate of 381 dB/second corresponding to an 11.4 msec time constant.

The BTSC encoding standard specifies a release rate of 381 dB ±5%. Meeting this release rate requirement is critical as it allows the decoder to track the encoder when in transition. A digital implementation allows this release rate requirement to be met almost exactly. This specification is not subject to the component tolerances, environmental effects, and unit variances that effect existing systems.

The square root is implemented via a series expansion using the first 30 terms of the series expansion shown in equation (10).

The variable spectral preemphasis feedback loop 640 samples the output of the downstream process of L−R channel 610, the spectral control bandpass filter 646 filters the output to eliminate the low and mid frequency energy while allowing the variable spectral preemphasis feedback loop to sense the high frequency energy. The output of the spectral control filter 646 is now provided to an rms detector which determines the rms equivalent voltage of the input signal. The rms detector 648 output is the value b which is used to update the coefficients of the variable spectral preemphasis filter.

L+R Path

The L+R path 660 begins with a 2X interpolator 662 which is implemented identically to the 2X interpolator 612 described above for the downstream process of the L−R channel 610. This exact match is essential to ensure the proper relationship between the L−R and L+R paths. The subject invention has the advantage over prior art that an exact match can be achieved, since said match is achieved by programming the interpolation process and other elements of the downstream process of the L+R channel The second stage of the L+R path is the 75 μsec preemphasis filter 664. This filter is modeled by a 1st order IIR section of the form shown in equation (9) with coefficients:

| b(1) = 1 | b(2) = −0.870129883 | a(2) = 0.8 |
| --- | --- | --- |

The filter is scaled as it was used in the recommended implementation. Other gain scaling is possible.

The final stage of the L+R path is the band limiting low pass filter (LPF) 666. For the subject invention this band limiting LPF 666 was modeled as a 12th order filter, implemented identically to the band limiting LPF mentioned above for the downstream process of the L−R channel. Once again an exact match is achieved with the L−R downstream LPF.

The L+R signal is interpolated at twice the sample rate by the 2X interpolation stage 662, the interpolated values are subjected to a 75 μsec preemphasis 664. The 75 μsec preemphasized L+R signal is then fed to the band limited lowpass filter 666 to eliminate any emphasized components above 15 KHz. Every other sample is now handed to the D/A (item 506 in FIG. 5) for transmission down the appropriate media. Critical matching to appropriate L−R downstream blocks is exactly achieved by using the same digital filters.

Figure 7:
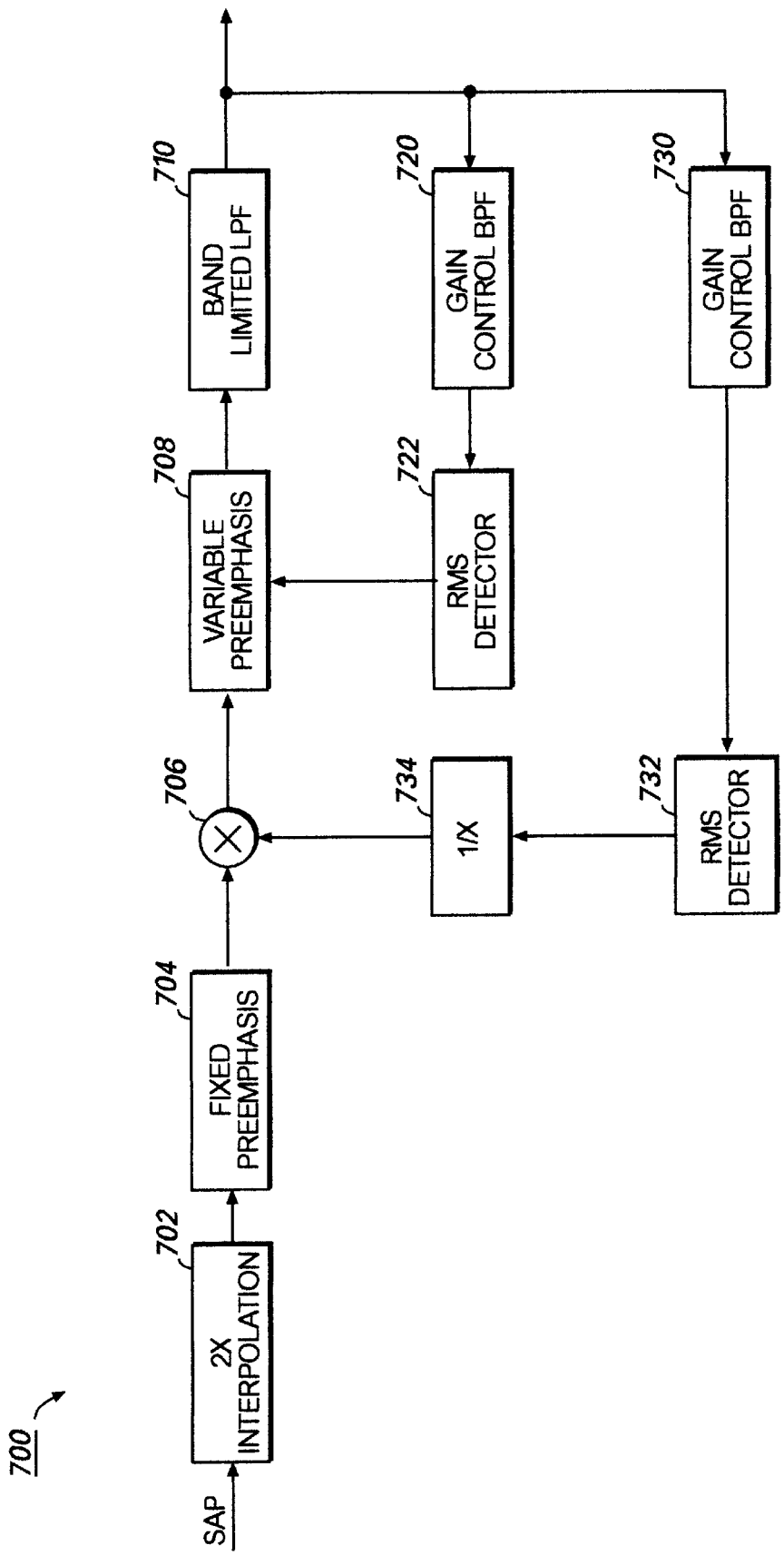
FIG. 7 illustrates an algorithm block diagram for the BTSC encoder in accordance with the invention, for the SAP channel.

FIG. 7 shows an algorithm block diagram 700 of the DSP processing for the SAP. Except for the modulation frequency of the SAP channel, the SAP channel is processed in the same manner as the L−R channel (item 606 in FIG. 6) discussed above. Due to the narrow bandwidth requirement (10 KHz) and reduced performance requirements of the SAP channel, A/D precision and filter matching are not as critical. As a result the SAP compressor can be designed more economically than the L−R subchannel compressor.

DSP CODE STRUCTURE

Figures 17A, 17B:
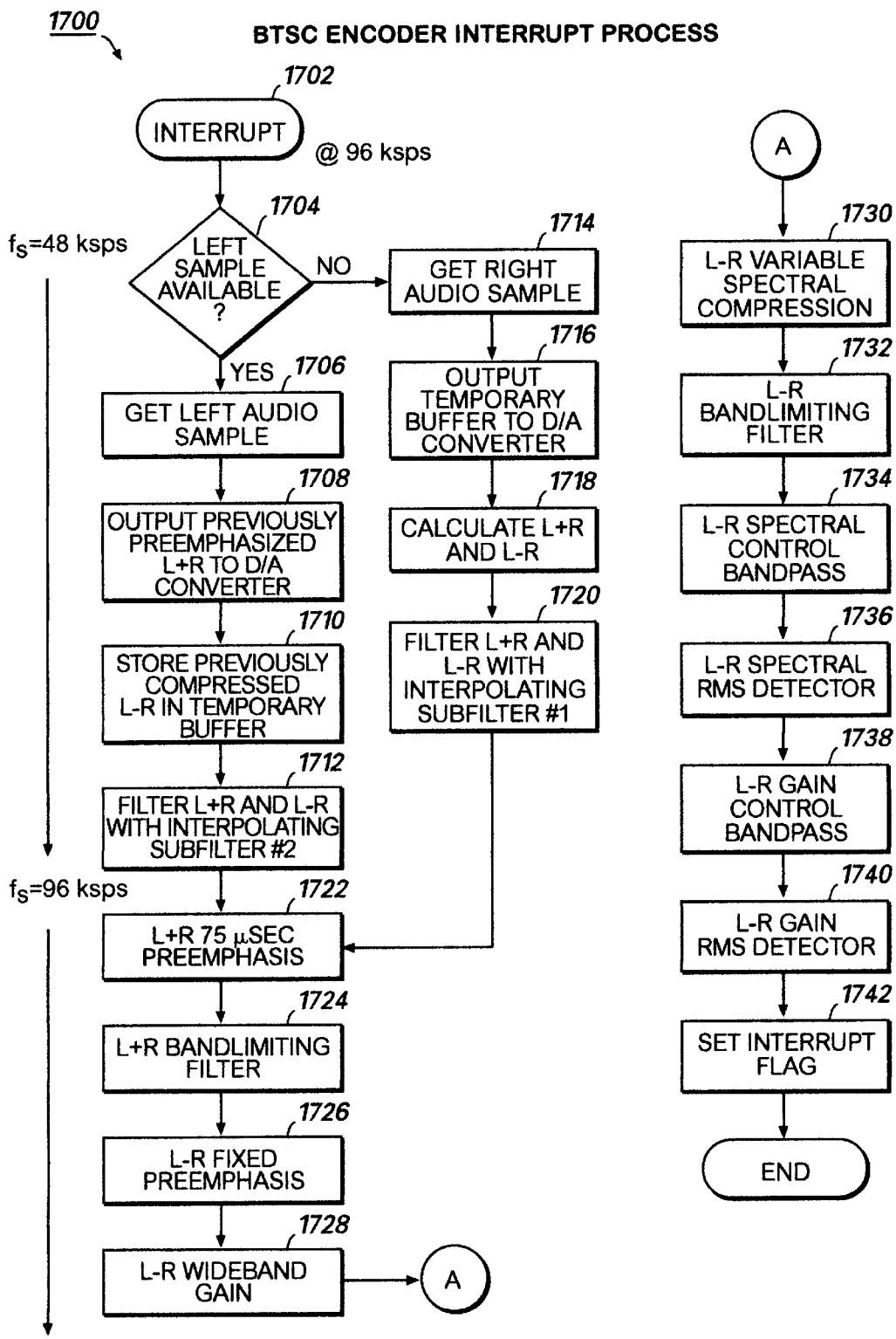
FIGS. 17A and 17B illustrate the BTSC encoder interrupt processing flow chart.
Figure 18:
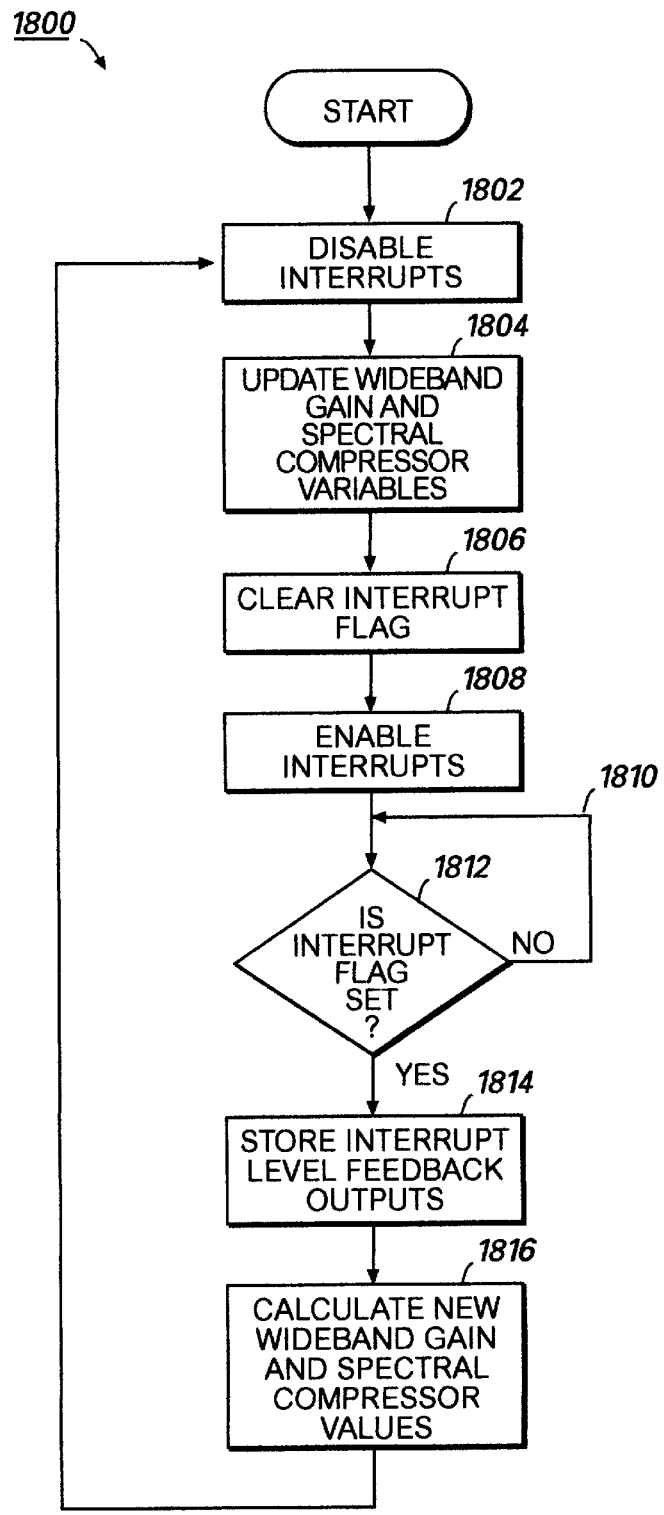
FIG. 18 illustrates the BTSC encoder non-interrupt processing flow chart.

The code of the preferred embodiment is broken down into two levels of processing, the interrupt level processing and the noninterrupt level processing, shown in FIGS. 17A–17B and 18 respectively. Interrupt level processing must be completed before the next interrupt occurs. Interrupt level processing always begins upon reception of an interrupt and it always takes priority over noninterrupt level processing.

The preferred embodiment for the interrupt level processing and noninterrupt level processing uses a stereo A/D and stereo D/A interfaced to the synchronous serial port of a general purpose DSP chip, such as a Motorola 56002. The A/D and D/A share common clock signals and are sampled at 48 KHz. With the DSP in network mode and the A/D and D/A transferring data in an $I^2S$ format, interrupts are received by the DSP every $1/96000$ seconds. The interrupts alternately deliver left and right samples. Since the A/D and D/A share the same clock, transmit to DSP and receive from DSP processing can share a single interrupt. This sharing of interrupts works well as long as it is realized that the transmit and receive events have a subtle time skew with respect to each other. The fact that interrupts are received exactly at every $1/96000$ works well since 96 KHz is the desired sample rate after interpolation.

Interrupt Level Processing

FIG. 17A is a flow chart 1700 of the interrupt level processing. Upon receipt of an interrupt 1702, every $1/96000$ seconds, the program first determines 1704 whether a left or right sample has been received. This is easily accomplished since a typical processor, such as the Motorola 56002 used in this implementation, has a status bit that indicates which sample is nearest to the serial interface frame synch signal. The $I^2S$ format guarantees that the sample closest to the frame synch corresponds to the left channel.

If a left channel is received, the following events occur:

(1) The left sample is acquired and stored. 1706

(2) The preemphasized L+R sample from the previous interrupt processing is output 1708 to the D/A. All L+R computation is done at the interrupt level. The preemphasized L+R will not be output until another left input is received. Thus, the sample is output at a 48 KHz rate and has been decimated, since every other sample of 96 KHz is 48 KHz, to interface to the D/A.

(3) The output of the L−R bandlimiting LPF is stored 1710 for output to the D/A on the next interrupt. This ensures that the preemphasized L+R and compressed L−R signal output simultaneously from the stereo D/A and will not have a one-sample phase skew with respect to each other. In other words, this ensures that each 48 KHz output represents an L−R and L+R sample from the same point in time.

(4) Interpolating 1712 subfilter #2 filters L+R and L−R. See the interpolating filter discussion above for an explanation of the subfilter structure.

If a right channel is received, the following events occur:

(1) The right sample is acquired and stored. (1714)

(2) The L−R sample stored 1716 during the previous interrupt is output to the D/A.

(3) Since a complete signal sample set, for a given point in time, has been received, the L+R and L−R are calculated. 1718

(4) Interpolating 1720 subfilter #1 filters L+R and L−R.

At this point, whether a left channel or a right channel was received, the interrupt processing is sequential, consisting of the following steps:

(1) 75 μsec preemphasis 1722 is performed on the interpolated L+R sample.

(2) L+R bandlimiting 1724 is performed. At this point L+R signal has been preemphasized and no other processing is required.

(3) Fixed preemphasis 1726 is performed on the L-R signal.

(4) Wideband gain multiplication 1728 is performed on the L-R signal.

(5) Variable spectral compression 1730 is performed upon the L-R signal.

(6) L-R bandlimiting 1732 is performed. At this point the L-R is ready both for output and for insertion into the to feedback paths for updating the wideband gain and variable spectral preemphasis filter.

(7) The output L-R signal is run through the spectral control bandpass filter. (1734)

(8) The output of the spectral control bandpass filter is run through the L-R spectral rms detector 1736 with integrator time constant equal to 11.4 msec. At this point all interrupt level processing of the L-R variable spectral filter feedback is complete.

(9) The output L-R signal is run through the gain control bandpass filter. (1738)

(10) The output of the gain control bandpass filter is run through the L-R gain rms detector 1740 with integrator time constant equal to 34.7 msec. At this point all interrupt level processing of the L-R variable gain control feedback is complete. Lastly a flag is set 1742 to indicate that an interrupt has been processed.

Interrupt level processing determines whether a left or right sample has occurred. Measures are taken to ensure that input and output samples are synchronized properly in time. Subsequent processing occurs in sequential order as shown above.

Noninterrupt Level Processing

FIG. 18 is a flow chart 1800 of the noninterrupt level processing. Noninterrupt processing takes place during the idle time, after interrupt processing and before the next interrupt occurs. Depending on the bandwidth of the DSP processor it usually takes several interrupts before the wideband gain and variable spectral preemphasis filters are updated. This delay is in the order of tens of microseconds, which is inconsequential compared to the 34.7 and 11.4 millisecond time constants of the feedback loops.

When noninterrupt processing begins the interrupts are disabled 1802 for a few instruction cycles to allow the code to update the wideband gain setting and variable spectral preemphasis coefficients. The interrupts are disabled so that changes to the wideband gain and variable preemphasis occur at the same interrupt. After the update 1804, the interrupt flag is cleared 1806. At this point the interrupts are enabled 1808 and the DSP enters a loop 1810 waiting for the next interrupt to occur 1812. After the next interrupt has occurred, the DSP latches 1814 the interrupt level outputs from the gain and variable spectral preemphasis rms detector outputs. The new value for the wideband gain are then calculated 1816 in the following sequence:

(1) Take the square root of the rms detector outputs. This converts the rms detector output from a power to voltage.

(2) The resultant voltage is inverted to generate the new wideband gain setting.

The new coefficients for the variable spectral preemphasis filter are calculated in the following sequence:

(1) Take the square root of the rms detector outputs. This converts the rms detector output from a power to voltage. This is the new value of b utilized by equation (6).

(2) The new variable spectral preemphasis coefficients are calculated, utilizing the value b above, as per equation (6). This calculation utilizes the multiply and divide resources provided by the DSP chip.

Noninterrupt processing occurs during those points in time when interrupt processing is not occurring. Noninterrupt processing first utilizes the wideband gain feedback loop interrupt level output to calculate the square root and 1/x in order to fix the wideband gain factor. Noninterrupt processing next takes the square root of the variable spectral preemphasis loop interrupt level output to calculate b. Next b is used to calculate the new coefficients for the variable spectral preemphasis filter.

What is claimed is:

1. A system for generating a broadcast television stereo signal from a left-channel signal and a right-channel signal, the system comprising:

(a) an analog-to-digital converter for converting the right-channel signal to a right digital signal and for converting the left-channel to a left digital signal;

(b) means coupled to the analog-to-digital converter for generating a summation signal comprising the sum of the right digital signal and the left digital signal, and for generating a difference signal comprising the difference between the right digital signal and the left digital signal;

(c) means for generating a first digitally pre-emphasized signal corresponding to the summation signal, and for generating a second digitally pre-emphasized signal corresponding to the difference signal;

(d) means for transforming the first pre-emphasized signal to a digital BTSC L+R signal and for transforming the pre-emphasized second signal to a digital BTSC L-R signal;

(e) a digital-to-analog converter for converting the digital BTSC L+R signal to an analog BTSC L+R signal and for converting the digital BTSC L-R signal to an analog BTSC L-+R signal; and (f) means for modulating the analog L+R signal and the analog L-R signal onto a carrier wave.

2. The system of claim 1, wherein the generating means comprises a digital signal processor circuit programmed to digitally add pre-emphasis to the first signal and to the second signal, respectively.

3. The system of claim 1, wherein the transforming means includes an L-R data path and an L+R data path, each path having a preselected sample rate.

4. The system of claim 3, wherein the L-R data path comprises:

(a) means for interpolating the preselected sample rate to a second sample rate, the second sample rate being faster than the preselected sample rate, thereby generating a sample rate-interpolated L-R signal;

(b) means for adding fixed pre-emphasis to the sample rate-interpolated L-R signal; and (c) second means for transforming the sample rate-interpolated L-R signal to the digital BTSC L-R signal.

5. The system of claim 4, wherein the second transforming means comprises a digital wide-band feedback loop.

6. The system of claim 4, wherein the second transforming means comprises:

a. a digital multiplier having a first input and a second input and an output, the output generating a value equal to the first input multiplied by the second input, the first input being responsive to the sample rate-interpolated L−R signal;

b. a variable spectral pre-emphasis feed-back loop responsive to the output of the digital multiplier, for generating the digital BTSC L−R signal;

c. a gain control filter, having an output, responsive to the BTSC L−R signal;

d. an RMS detector, responsive to the output of the gain control; and e. a 1/x inverter, responsive to the output of the RMS detector, for generating a signal for input to the second input of the digital multiplier.

7. The system of claim 6, wherein the variable spectral pre-emphasis feed-back loop comprises:

a. means, responsive to a first input and a feedback input, for generating variable pre-emphasis signal based on a signal from the first input and a signal from the feed-back input, the first input being responsive to the output of the digital multiplier;

b. a band limited low pass filter, responsive to the variable preemphasis signal, for generating the digital BTSC L−R signal;

c. a gain control band pass filter, responsive to the BTSC L−R signal, for generating a gain control filtered signal; and d. a root-mean-square detector, responsive to the gain control filtered signal, for generating an RMS signal input to the feedback input of the variable pre-emphasis signal generating means.

8. The system of claim 3, wherein the L+R data path comprises:

a. means for interpolating the preselected sample rate to a second sample rate, the second sample rate being faster than the preselected sample rate, thereby generating a sample rate-interpolated L+R signal;

b. means for adding 75 micro-second pre-emphasis to the sample rate-interpolated L+R signal to generate a pre-emphasized L+R signal;

c. a digital band limited low pass filter, responsive to the pre-emphasized L+R signal, for generating a band limited L+R signal; and d. means for compensating for gain and phase differences between the BTSC L−R signal and the band limited L+R signal and for generating a BTSC L+R signal.

9. A process for generating a broadcast television stereo signal from a left-channel signal and a right-channel signal, the process comprising:

(a) converting the right-channel signal to a right digital signal;

(b) converting the left-channel to a left digital signal;

(c) generating a summation signal comprising the sum of the right digital signal and the left digital signal;

(d) generating a difference signal comprising the difference between the right digital signal and the left digital signal;

(e) generating a first digitally pre-emphasized signal corresponding to the summation signal;

(f) generating a second digitally pre-emphasized signal corresponding to the difference signal;

(g) transforming the first pre-emphasized signal to a digital BTSC L+R signal;

(h) transforming the pre-emphasized second signal to a digital BTSC L−R signal;

(i) converting the digital BTSC L+R signal to an analog BTSC L+R signal;

(j) converting the digital BTSC L−R signal to an analog BTSC L−+R signal; and (k) modulating the analog L+R signal and the analog L−R signal onto a carrier wave.

* * * * *